(12) United States Patent
Yang et al.

(10) Patent No.: US 12,274,099 B2
(45) Date of Patent: Apr. 8, 2025

(54) DUAL EMBEDDED STORAGE NODES AND VERTICAL TRANSFER GATES FOR PIXELS OF GLOBAL SHUTTER IMAGE SENSORS

(71) Applicant: Apple Inc., Cupertino, CA (US)

(72) Inventors: Dajiang Yang, Cupertino, CA (US); Hong Wei Lee, San Jose, CA (US); Xiaofeng Fan, San Jose, CA (US); Oray O. Cellek, Santa Cruz, CA (US); Xiangli Li, Palo Alto, CA (US); Kai Shen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 61 days.

(21) Appl. No.: 17/707,495

(22) Filed: Mar. 29, 2022

(65) Prior Publication Data
US 2022/0320174 A1    Oct. 6, 2022

Related U.S. Application Data

(60) Provisional application No. 63/169,089, filed on Mar. 31, 2021.

(51) Int. Cl.
| | |
|---|---|
| *H01L 27/146* | (2006.01) |
| *G02B 3/00* | (2006.01) |
| *H04N 25/20* | (2023.01) |
| *H04N 25/532* | (2023.01) |
| *H04N 25/771* | (2023.01) |
| *H10F 39/00* | (2025.01) |
| *H10F 39/18* | (2025.01) |

(52) U.S. Cl.
CPC ......... *H10F 39/811* (2025.01); *G02B 3/0037* (2013.01); *H04N 25/20* (2023.01);
(Continued)

(58) Field of Classification Search
CPC . G02B 3/0037; G02B 5/0231; H01L 27/1461; H01L 27/14614; H01L 27/14627;
(Continued)

(56) References Cited

U.S. PATENT DOCUMENTS 8,878,264 B2 * 11/2014 Velichko ............. H01L 27/1461
                                                                257/256
9,281,331 B2    3/2016 Chen et al.
(Continued)

OTHER PUBLICATIONS

Shen, et al., "Global Shutter Efficiency Improvement to >100dB in Advanced Global Shutter Imager with Correction Processing," *Environmental Science* 2019, 4 pages.
(Continued)

*Primary Examiner* — Antoinette T Spinks
(74) *Attorney, Agent, or Firm* — Brownstein Hyatt Farber Schreck, LLP

(57) ABSTRACT

Disclosed herein are global shutter image sensors and methods of operating such image sensors. An image sensor includes a semiconductor wafer having a light receiving surface opposite an electrical connection surface; an oxide extending from the light receiving surface toward the electrical connection surface and at least partially surrounding a pixel region; a photodiode disposed within the pixel region; and a set of storage nodes disposed under the photodiode, between the photodiode and the electrical connection surface. The set of storage nodes comprises a first storage node and a second storage node. The storage nodes may be disposed vertically beneath the photodiode, or side by side.

17 Claims, 19 Drawing Sheets

(52) U.S. Cl.
CPC ......... *H04N 25/532* (2023.01); *H04N 25/771* (2023.01); *H10F 39/18* (2025.01); *H10F 39/8033* (2025.01); *H10F 39/80373* (2025.01); *H10F 39/8063* (2025.01); *H10F 39/807* (2025.01)

(58) Field of Classification Search
CPC ........... H01L 27/1463; H01L 27/14636; H01L 27/14643; H04N 25/53; H04N 25/771; H04N 5/33; H04N 25/20; H04N 25/532; H04N 25/77
See application file for complete search history.

(56) References Cited

U.S. PATENT DOCUMENTS

| | | | |
|---|---|---|---|
| 10,163,963 B2 | 12/2018 | Janssens et al. | |
| 10,462,402 B2 | 10/2019 | Fan | |
| 11,558,569 B2 * | 1/2023 | Agranov | H04N 25/53 |
| 11,683,601 B2 * | 6/2023 | Kato | H04N 25/618 |
| | | | 348/302 |
| 11,955,503 B2 * | 4/2024 | Yoshiharu | H04N 25/65 |
| 2008/0308855 A1 * | 12/2008 | El-Kareh | H10B 41/35 |
| | | | 257/E21.409 |
| 2016/0155745 A1 * | 6/2016 | Tang | H01L 29/78 |
| | | | 257/334 |
| 2020/0098819 A1 * | 3/2020 | Lenchenkov | H01L 27/14623 |
| 2020/0266221 A1 * | 8/2020 | Uchida | H01L 27/14654 |
| 2020/0279879 A1 | 9/2020 | Ebiko et al. | |
| 2021/0029321 A1 | 1/2021 | Ma et al. | |
| 2021/0392283 A1 * | 12/2021 | Agranov | H04N 25/75 |
| 2023/0005983 A1 * | 1/2023 | Yoshiharu | H04N 25/59 |

OTHER PUBLICATIONS

Yokogawa, et al., "IR sensitivity enhancement of CMOS Image Sensor with diffractive light trapping pixels," *Scientific Reports*, vol. 7, No. 3832, Jun. 19, 2017, pp. 1-9.

* cited by examiner

DUAL EMBEDDED STORAGE NODES AND VERTICAL TRANSFER GATES FOR PIXELS OF GLOBAL SHUTTER IMAGE SENSORS

CROSS-REFERENCE TO RELATED APPLICATIONS

This application claims the benefit under 35 U.S.C. § 119(e) of U.S. Provisional Patent Application No. 63/169,089, filed Mar. 31, 2021, the contents of which are incorporated herein by reference in its entirety.

FIELD

The present disclosure generally relates to global shutter image sensors and, more particularly, to configurations of the pixels of global shutter image sensors. A global shutter image sensor may be included, for example, in electronic devices such as cell phones.

BACKGROUND

Electronic devices are commonplace in today's society; examples of such electronic devices include cell phones, tablet or desktop computers, and personal digital assistants, among others. Many such electronic devices are equipped with cameras (image sensors) that include an array of pixels. Each pixel may include a photodiode. Light impinging on a photodiode may generate charge carriers that migrate to other structures (e.g., one or more storage nodes) of a pixel.

Generation and movement of the light-induced charge carriers may be controlled by electrical components that are associated with the pixel, such as transistors or other gating structures. For example, the light-induced charge carriers generated by a photodiode may be moved to a storage node or nodes of a pixel through one or more transistors.

The storage node(s) and other electrical components of a set of pixels may in some cases be fabricated, together with the photodiodes for the set of pixels, as an integrated circuit formed on a single wafer. However, the electrical components associated with the photodiodes may reduce the area available for photodiodes, and thus reduce light reception and corresponding charge carrier generation.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

Disclosed herein is an image sensor. The image sensor may include a semiconductor wafer with a light receiving surface opposite an electrical connection surface. An oxide may extend from the light-receiving surface toward the electrical connection surface and at least partially surround a pixel region. The oxide may in some cases include deep trench isolation walls. A photodiode may be disposed within the pixel region. A set of storage nodes may be disposed under the photodiode, between the photodiode and the electrical connection surface.

In some embodiments, the image sensor may include an inert material layer adjacent to the light receiving surface, a silicon layer containing the photodiode beneath the inert material layer and interfacing with the inert material layer in an inverted pyramid array structure. The image sensor may also include first and second vertical transfer gates within the pixel region that extend from the electrical connection surface to the photodiode, and that are respectively proximate to the first and second storage nodes. The image sensor may further include a single on-chip lens or four on-chip lenses in a two-by-two array.

In some embodiments, the storage nodes within a pixel region may be positioned on a single layer within the pixel region. In other embodiments, the storage nodes may be placed in a vertical configuration below the photodiode toward the second side.

Also disclosed is an image sensor having a semiconductor wafer with a light receiving surface opposite an electrical connection surface. The image sensor may include a pixel extending between the light receiving surface and the electrical connection surface and enclosed by deep trench isolation walls that extend from the light receiving surface toward the electrical connection surface. The pixel may include, in layers extending from the light receiving surface, an inert material layer, a silicon layer that includes a photodiode, and an isolation well layer that includes a first storage node and a second storage node. The pixel may also include a first vertical transfer gate extending from the electrical connection surface to the photodiode and proximate to the first storage node. The first vertical transfer gate may be operable to control movement of charge carriers from the photodiode to the first storage node. The pixel may also include a second vertical transfer gate extending from the electrical connection surface to the photodiode and the second storage node. The second vertical transfer gate may be operable to control movement of charge carriers from the photodiode to the second storage node.

Also disclosed is a method of operating a pixel of an image sensor, such as one of the pixels in one of the embodiments just described. In some embodiments, a photodiode signal may be determined using a first charge in a first storage node, generated in the photodiode during a first time interval. A parasitic light signal may be determined using a second charge in a second storage node, generated during a second time interval. A difference between the photodiode signal and the parasitic light signal may be determined. In other methods, a light pulse may be emitted from a device associated with the image sensor, and a third signal may be determined using a third charge in the first storage node, generated in the photodiode during a third time interval during which reflections of the emitted light pulse are received. A fourth signal may be determined using a fourth charge in the second storage node, generated in the photodiode during a fourth time interval during which no reflections are received. A difference between the third and fourth signals may be used to compensate for received background light.

BRIEF DESCRIPTION OF THE DRAWINGS

The disclosure will be readily understood by the following detailed description in conjunction with the accompanying drawings, wherein like reference numerals designate like structural elements.

Figure 1A:
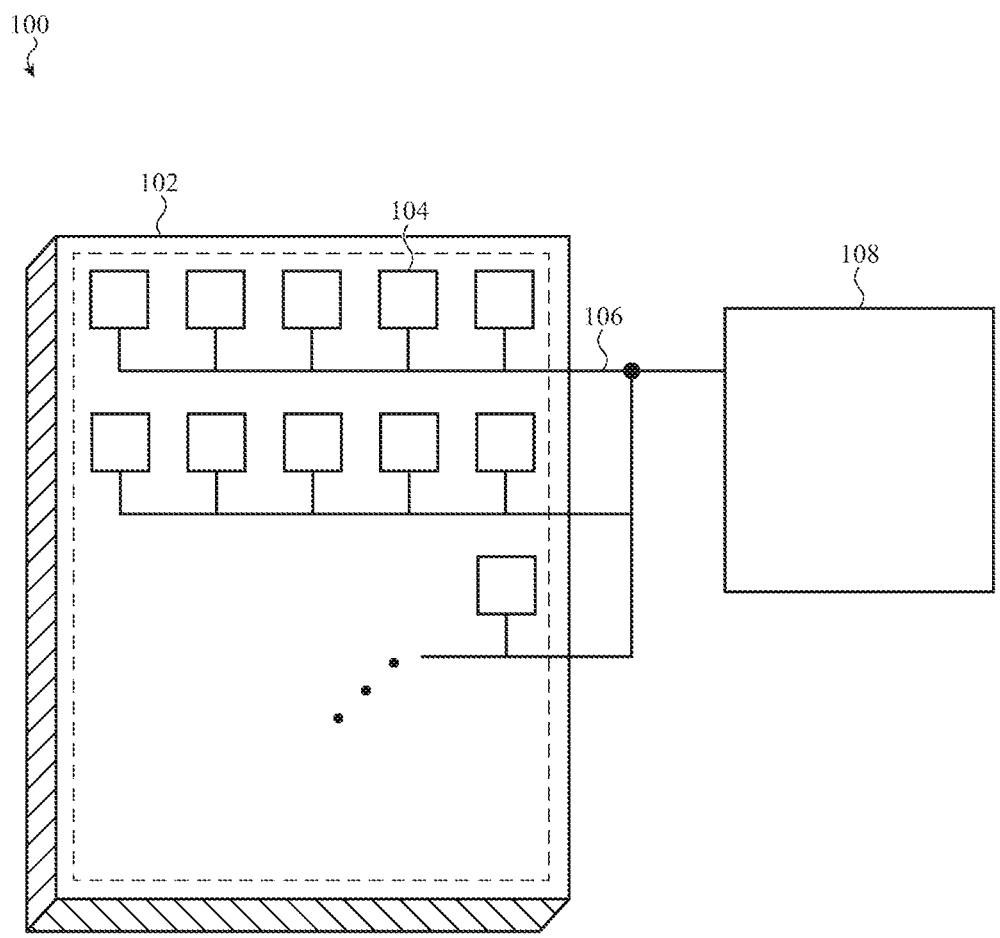
FIG. 1A shows a perspective view of an image sensor, according to an embodiment.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to image sensors, and components thereof, that include one or more light gathering and/or receiving elements (or just 'pixels').

Further, although camera-equipped electronic devices are mentioned below as using the embodiments, the image sensors, their components, and other embodiments described herein may be used with various electronic devices including, but not limited to, range finding devices (such as LIDARs) or their components, mobile phones, personal digital assistants, time keeping devices, health monitoring devices, wearable electronic devices, input devices (e.g., a stylus), desktop or laptop computers, electronic glasses, and so on. As used herein, an "image sensor" will refer to any sensor capable of collecting a 2-dimensional image, a 3-dimensional image, a depth map, and so on.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Image sensors described herein may contain one or more light receiving elements, or just 'pixels.' Each pixel may include a photosensitive semiconductor region, or 'pixel region,' or layer in which received photons generate charge carriers, often electrons, that move or migrate under applied voltages within the pixel to other structures of the pixel, or to other structures of the image sensor.

Image sensors may be implemented with at least one chip (circuitry fabricated or formed on a single semiconductor substrate) having an array of pixels. The pixels may be electrically isolated from each other, at least in part, by structures such as an electrically-isolating oxide, or deep trench isolation (DTI) or shallow trench isolation (STI) walls, formed from an electrically insulating material, that may extend from a light receiving surface or side of the chip and enclose the photosensitive regions of the pixels.

The photosensitive regions within a pixel may include a photodiode (e.g., a p-n semiconductor junction), as well as undoped regions. Hereinafter, for simplicity of explanation only, the semiconductor material, whether doped or undoped, will be described as silicon. However, one skilled in the art will recognize that the embodiments described herein may be implemented with other semiconductor materials, examples of which may include—but are not limited to—Gallium Arsenide or other III-V semiconductors, among others.

A pixel may be connected with respective control transistors, electrodes, and other components to control light reception and the movement or migration of charge carriers. Examples may include one or more of: bias voltage and ground connections or contacts, anti-blooming transistors, source follower (SF) and reset (RST) transistors, transfer transistors, read (or 'read out') transistors, row-select (RS) transistors, or still others, as would be known to one skilled in the art. An image sensor may include storage nodes: regions associated with one or more pixels to which a light-generated charge within a pixel may be moved.

Operational characteristics of an image sensor (e.g., light sensitivity) may depend on the percentage of the surface area of its light receiving surface, or 'side', that is available for the photo sensitive regions of the pixels to receive impinging photons. To increase that surface area, at least some of the control transistors, electrical connections or contacts, or other components may be fabricated on one side of a wafer or 'chip' of an image sensor that is opposite to the side or surface of the chip that is to be a light receiving surface of the image sensor. Herein, the side of an image sensor opposite to the light receiving surface will be referred to as 'electrical connection surface', or just the 'bottom' side. In some implementations, the image sensor may be fabricated as a pixel array chip that is joined at its bottom side with a second chip that contains at least some of the control transistors, electrical connections or contacts, or other components.

In various embodiments disclosed herein, one or more pixels of the image sensors may include a silicon layer that itself may include a photodiode. Light impinging on a pixel of the image sensor may generate charge carriers in the silicon layer. When the photodiode is biased during a shuttering operation (e.g., when a picture is being taken in a camera with the image sensor), movement of the charge carriers may be controlled by transfer gates or transistors to move to storage nodes. During a read out operation, the charges may be moved to and/or through a floating diffusion node under the control of read gates or transistors.

In some embodiments, at least two storage nodes are included within a pixel in the region enclosed by lateral DTI walls, and positioned under the photodiode opposite to the light gathering silicon layer. The two or more storage nodes may be separated from the silicon layer and the photodiode by a p-well isolation layer. Vertical transfer gates may extend from the bottom surface into the pixel to connect with the photodiode. The vertical transfer gates may control movement of charge carriers from the photodiode into the storage nodes. In these and other embodiments, using such a vertical stacking of some of the components of a pixel may allow the pixels and the image sensors to have a greater area on the light receiving surface through which light may be gathered or received.

In some embodiments, pixels may have two or more storage nodes positioned below, and separated from, the silicon layer and photodiode in a single lateral layer and enclosed by DTI walls of the pixels. Read gates or transistors associated with the pixels may be located either within the pixels near the bottom surface of the image sensor, or on the bottom surface. In some embodiments, the read gates may be located on a separate chip to which the pixel array chip is joined.

In still other embodiments, pixels may have at least two storage nodes positioned in a stacked or vertical configuration below the silicon layer and the photodiode. Respective vertical transfer gates may extend from the electrical connection surface of the pixel to the photodiode to provide a link or connection between the photodiode and the storage nodes. Respective vertical read gates may also extend from the bottom surface to the storage nodes to provide a connection or link between the storage nodes and a floating diffusion node.

In some embodiments, two or more storage nodes may allow for operations that compensate for parasitic light sensitivity of the pixels. In one operation, for example, a first vertical transfer gate allows a first storage node to receive charge carriers from the photodiode so that the first storage node will include those photodiode charge carriers and additionally any parasitically generated charge carriers. In a second storage node, a second vertical transfer gate blocks photodiode charge carriers from flowing into the second storage node, so that the second storage node only contains parasitically generated charge carriers. The charge in the second storage node may be used to generate a correction signal that can be subtracted from a corresponding signal based on the charge in the first storage node.

In another embodiment, either the image sensor or the device may include a light source, such as an infrared light source, that transmits pulses of light into the environment and the reflections thereof are received at the pixels of the image sensor. During a first time interval, in which the pulse of light is transmitted, a first storage node may collect charge carriers that are generated at the photodiode from background light and the received reflections of the pulse, and also parasitically generated charge carriers. During a subsequent second time interval, when no pulse is emitted, a second storage node may collect charge carriers that are generated at the photodiode only from the background light, and also charge carriers generated parasitically. Then a signal measuring just the reflected light may be obtained by obtaining a signal from the first storage node and subtracting a signal from the second storage node. In these embodiments, the image sensor, or one or more of its pixels, may include a dual bandpass filter that passes visible light and the infrared pulse light into the pixels, but filters light outside those light bands.

These and other embodiments are discussed in more detail below with reference to FIGS. 1A-6. However, those skilled in the art will readily appreciate that the detailed description given herein with respect to these Figures is for explanatory purposes only and should not be construed as limiting.

FIGS. 1A-D show certain exemplary configurations of image sensors and included pixels and associated components, such as may be used by or implement the embodiments to be described herein. These configurations are presented to provide a context and a framework for understanding the various embodiments, and do not imply limitations on the embodiments; the embodiments may be implemented as, or used as part of, image sensors with different configurations of components.

FIG. 1A shows a perspective view of an image sensor 100 that includes an array of pixels, such a pixel 104. As shown, the image sensor 100 includes a pixel array chip 102 configured with a rectangular array of pixels, and possibly other associated electrical components, though this is not required. The image sensor 100 may be formed as a single semiconductor chip or wafer that includes the pixel array chip 102, using various deposition and/or implantation technologies, as would be known to one skilled in the art. Additionally and/or alternatively, in some embodiments the image sensor 100 may be implemented with a stacked chip or wafer configuration having a pixel array chip 102 joined with an associated electronics chip as explained below.

The pixels of the image sensor 100 may be connected by electrical connections 106 to associated electronics 108. The electrical connections 106 may provide triggering 'on' and 'off' of photodiodes within the pixels, may transmit or receive signals to or from gates or transistors associated with each pixel, and may receive signals from the pixels. While shown as a single connection line, one skilled in the art will understand that the electrical connections 106 may be implemented with multiple connection lines, and may be formed on either the light receiving surface (or just the 'top') of the image sensor 100, within it, or on the electrical connection surface (or just a 'bottom') surface opposite the top surface, which may have at least some of the electrical connections 106.

The image sensor 100 may be operably connected to the associated electronics 108. The associated electronics 108 may include components for signaling to the image sensor 100, memory, amplification, signal processing, or other operations. The associated electronics may, in part, be components of another chip or wafer to which the pixel array chip 102 is bonded, so that the electrical connections 106 are implemented as surface contacts between the two chips.

Figure 1B:
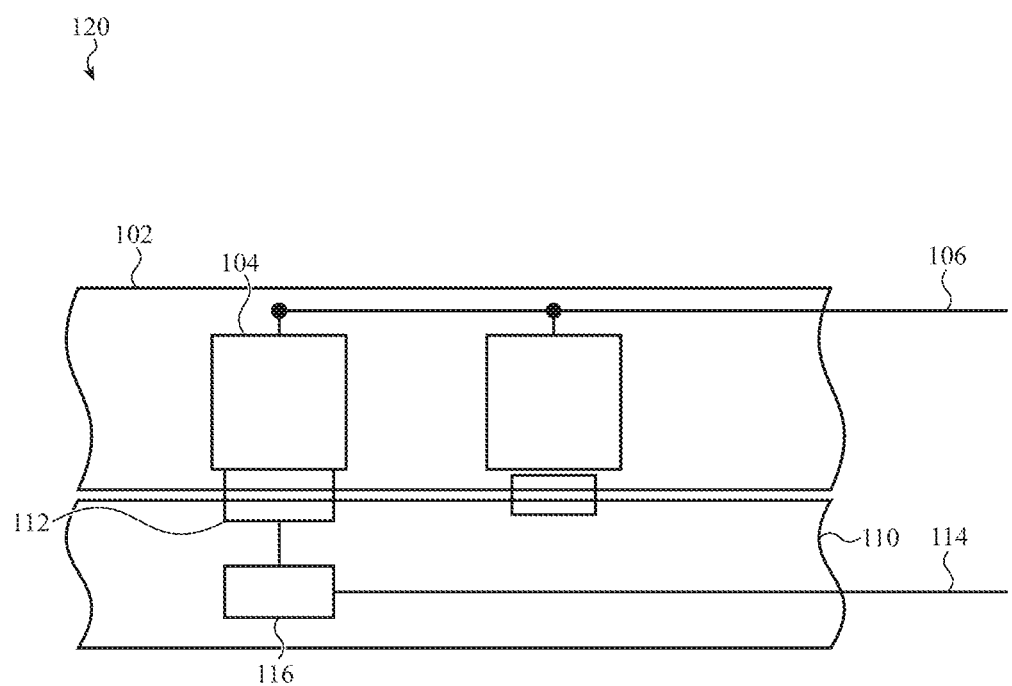
FIG. 1B shows a cross-sectional view of an image sensor, according to an embodiment.

FIG. 1B shows a cross-sectional view 120 of part of an image sensor 100 that includes a pixel array chip 102 that is joined with an associated electronics chip 110. In the example shown, the pixel array chip 102 includes the pixel 104 that extends from a light receiving surface, shown at the top of FIG. 1B, to electrical or signal connections 106. The electrical or signal connections 106 may provide electrical or signal connections between any of the upper pixel array chip 102, supply voltages, the lower associated electronics chip 110, or other components of the image sensor 100. The associated electronics chip 110 may include at least one control component 116 connected through an electrical interconnection 112, such as a via, to the pixel 104. The associated electronics chip 110 may have an electrical or signal connection 114 that connects with pixel array chip 102, voltage supplies or other components of the image sensor 100.

Figure 1C:
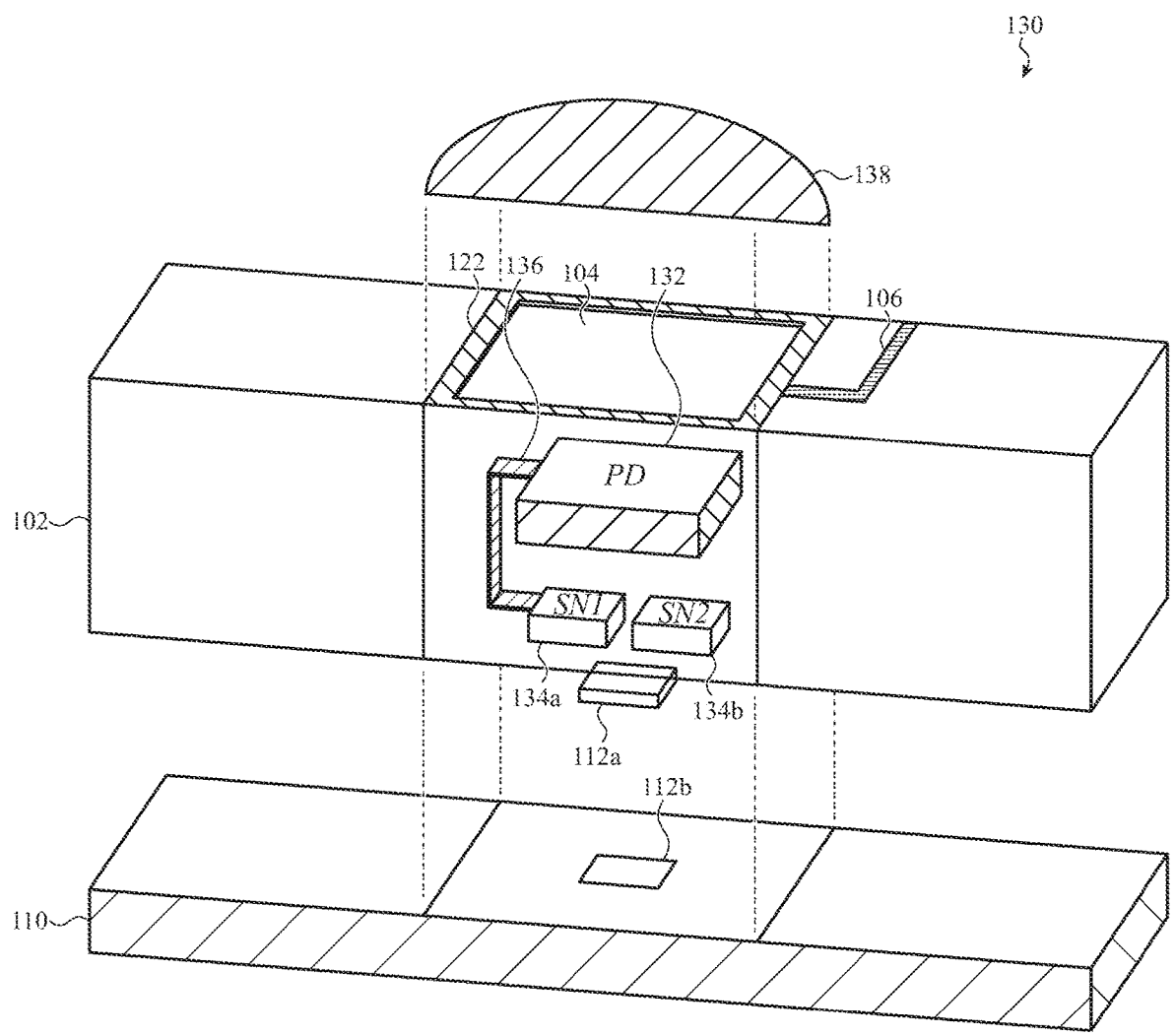
FIG. 1C shows an exploded view of select components of an image sensor, according to an embodiment.

FIG. 1C shows an exploded, cut away, perspective view 130 of a section of an image sensor 100 that includes an upper pixel array chip 102 formed in a first, single semiconductor wafer. The pixel array chip 102 joins with the associated electronics chip 110. The pixel array chip 102 has an electrical connection 112a that connects to the electrical connection 112b of the associated electronics chip 110 that is formed in a second chip or wafer, and then joined to the pixel array chip 102 of the image sensor 100.

Within the pixel array chip 102 is the pixel 104 that is enclosed by deep trench isolation (DTI) walls 122. In some embodiments, some or all of the pixels of the pixel array chip 102 are electrically isolated by a grid of such DTI walls, which may be formed from an insulator material, such as silicon dioxide or another electrically isolating material. The DTI walls 122 extend approximately perpendicularly (or 'vertically') from the light receiving, or 'top', surface of the image sensor 100 into the top pixel array chip 102. In some embodiments, the DTI walls may extend to the bottom surface of the pixel array chip 102.

An electrical connection 106 is shown on the light receiving, or 'top', surface of the image sensor 100. The electrical connection 106 may provide biasing or supply voltage to the pixel 104, or another signal to or from another component of the pixel 104. On the top surface of the image sensor 100, above the pixel 104, may be placed an on-chip lens 138 to direct or focus light into the pixel 104. Additionally and/or alternatively, a color filter, such as a color filter of a Bayer pattern, may be interposed between the on-chip lens 138 and the pixel 104.

The pixel 104 includes a photodiode (PD) 132. The photodiode 132 may be a p-n junction formed within a silicon (doped or undoped) layer within the pixel 104. The pixel 104 may also contain two storage nodes (SNs): 134a (shown as SN1) and 134b (SN2). The storage nodes 134a and 134b may be located below the photodiode 132, as determined by an axis from the light receiving surface to the bottom surface of the chip of the image sensor 100, but may be separated from the photodiode 132 by an intervening layer, such as may be formed from a p-well material. The storage nodes 134a and 134b receive light induced charge carriers generated in the photodiode 132 or its adjoining silicon layer. As described in more detail below, in various embodiments, storage nodes, such as storage nodes 134a and 134b, are located within the DTI walls 122 to allow the image sensor 100 to have either more pixels, a greater light receiving area for its pixels, or for the pixels to be placed more closely together, as there may be no need for the storage nodes to be placed in sections of the image sensor 100 between pixels.

The pixel 104 may also contain a vertical transfer gate 136 that may either allow or block movement of light induced charge carriers from the photodiode 132 to the storage node 134a. The vertical transfer gate 136 may be implemented as a channel of a field effect transistor (e.g., PMOS, NMOS, or CMOS), or by another technology, as would be understood by one skilled in the art. The vertical transfer gate 136 may extend from near or at the electrical connection surface ('bottom') of the chip of the image sensor 100 to the photodiode 132. Electrical control connections for the vertical transfer gate 136, such as a source and/or drain, may be positioned either within the pixel 104, on the light receiving side, or on the bottom side of the image sensor 100. The pixel 104 may also contain a second vertical transfer gate to control charge carrier flow from the photodiode 132 to the second storage node 134b, but for clarity it is not shown in FIG. 1C.

The light induced charge carriers may be generated during a shutter operation of the image sensor 100. For example, in a global shutter operation, all pixels of the image sensor 100 are activated in a single time interval to generate charge carriers in the pixels, with the charge carriers then being transferred, processed, and read out by other electrical components associated with the image sensor 100.

The pixel array chip 102 may be fabricated to implement back side illumination in which photosensitive semiconductor regions of the pixel are positioned near or adjacent to a light receiving surface of the image sensor 100. This is the configuration implicit in the descriptions of FIGS. 1A-C, and in the descriptions of the embodiments below. However, one skilled in the art will recognize that the embodiments described below may be also be fabricated with front side illumination techniques, such as may have wiring contacts and associated components between the light receiving surface and the photosensitive regions (such as the photodiode).

Figure 1D:
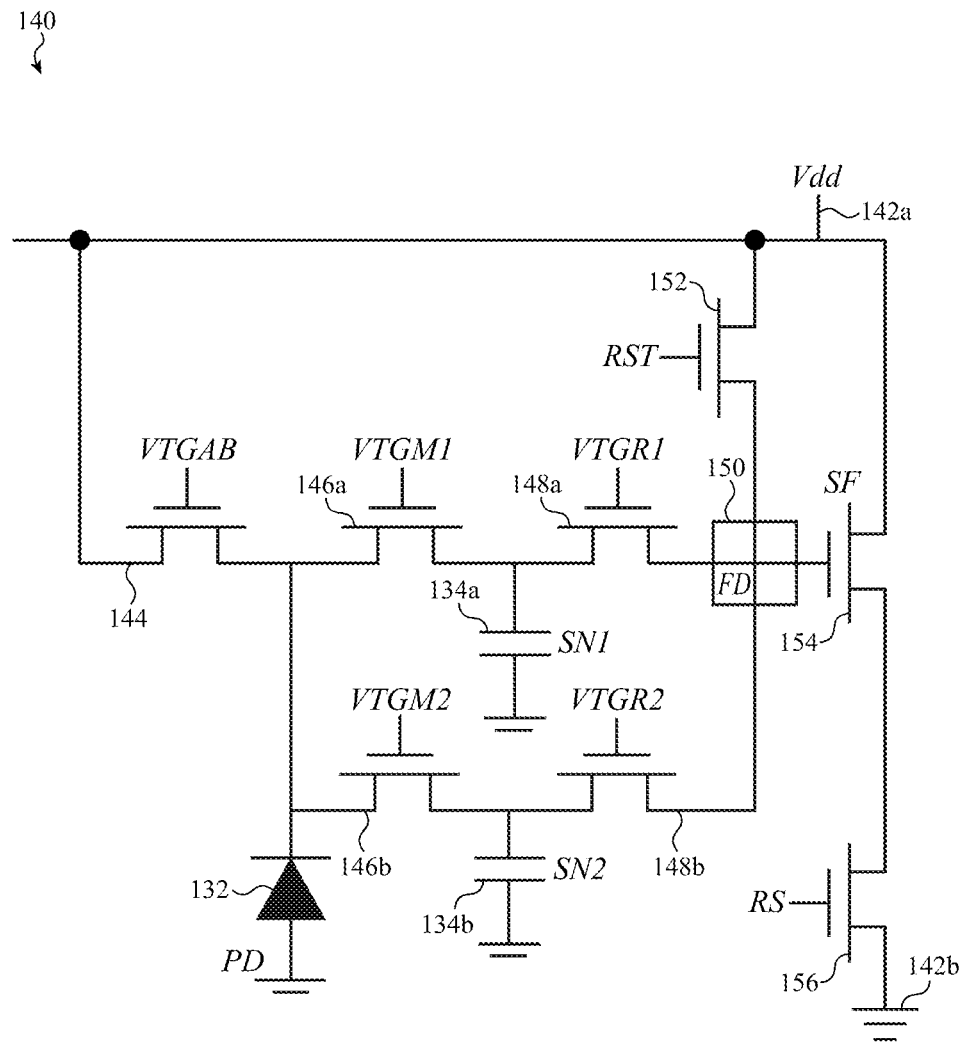
FIG. 1D illustrates an equivalent circuit diagram of a pixel of an image sensor.

FIG. 1D shows an equivalent circuit diagram 140 of the pixel 104 and certain associated biasing, control, and read out circuit elements. Some embodiments may implement similar or alternative equivalent circuits.

The equivalent circuit diagram 140 includes a supply voltage $V_{DD}$ 142a and a ground voltage 142b. The embodiments may also be implemented with a negative voltage supply (not shown), such as for the control transistors, though this is not required. The pixel 104 contains the PD 132, which is biased at its cathode from the supply voltage $V_{DD}$ 142a through an anti-blooming transistor 144. The PD 132 is connected at its cathode to first and second vertical transfer gates to memory 146a and 146b (labeled as VTGM1 and VTGM2, or just 'transfer gates') that control charge carrier movement to the storage nodes 134a and 134b. The storage nodes 134a and 134b may function as capacitive circuit elements to store the charges. In turn, each of the storage nodes 134a and 134b is connected through respective transfer read gates 148a and 148b (labeled TRGR1 and TRGR2, or just 'read gates') to the floating diffusion (FD) node 150. A reset (RST) transistor 152 may function to clear charges from the FD node 150, such as between shutter operations.

A voltage or other input at the FD node 150 may control the gate of the source follower (SF) transistor 154, whose drain is connected to the source of the row select (RS) transistor 156.

In some embodiments described below, the RST transistor 152, the SF transistor 154, and the RS transistor 156 are exterior to the pixel 104, such as either on the electrical connection surface of the pixel array chip 102 or on the lower associated electronics chip 110 shown in FIG. 1C. Alternatively, some embodiments may include the RST transistor 152, the SF transistor 154, and the RS transistor 156 interior to the pixel 104.

The particular configurations and components of the image sensor 100 and pixel 104 shown in FIGS. 1A-1D are to be understood as providing a background for understanding the embodiments to be described in relation to the following figures, and are not to be understood as limiting. Hereinafter, as will be clear from context, the term 'image sensor' will be used to refer either to a single chip having a pixel array fabricated with associated electrical components, or to the combination of a pixel array chip and an associated electronics chip to which the pixel array chip is connected in a stacked chip configuration.

Figure 2A:
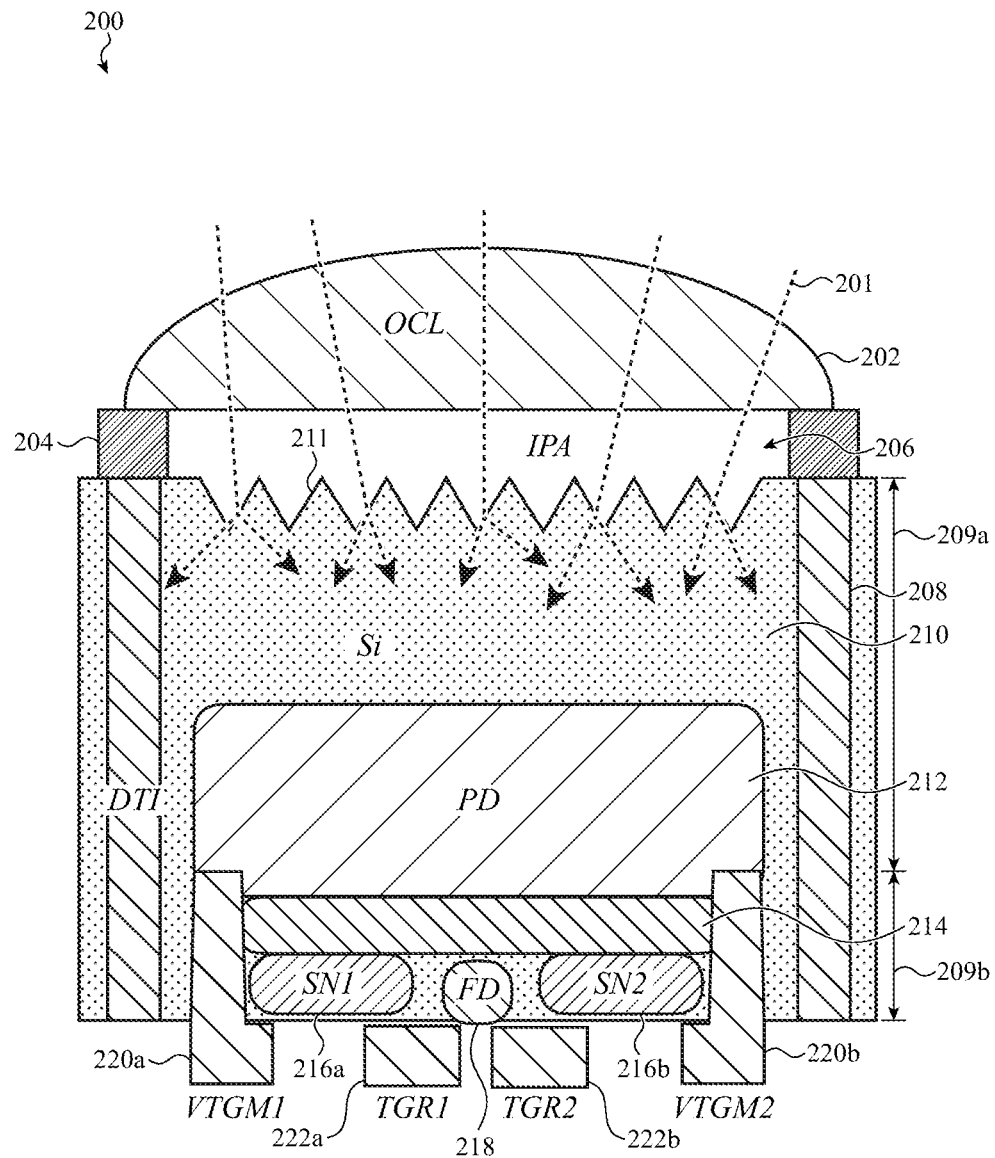
FIG. 2A illustrates a cross-sectional view of a pixel of an image sensor, according to an embodiment.
Figure 2B:
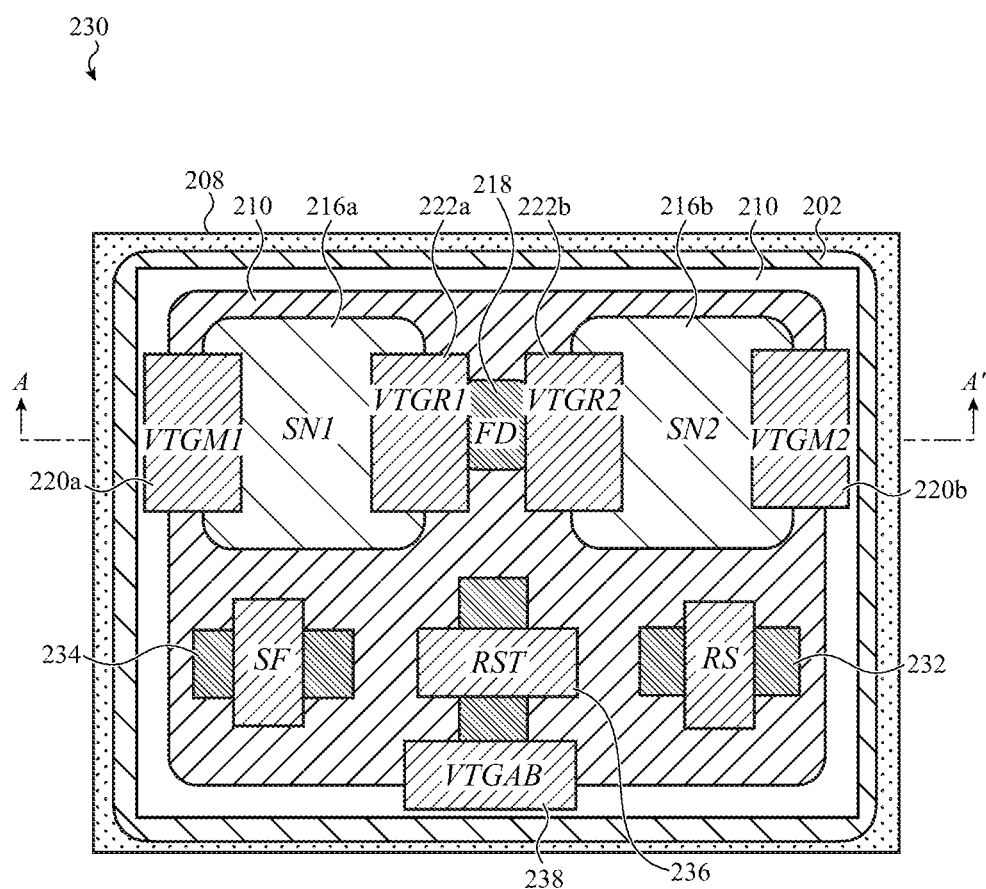
FIG. 2B illustrates a plan view of a pixel of an image sensor.

FIGS. 2A and 2B show different views of an embodiment of a pixel 200 within an image sensor in which multiple storage nodes are positioned within DTI isolation walls beneath (with respect to the light receiving surface of the image sensor) a photodiode. FIG. 2A provides a cross-sectional view of the pixel 200 obtained along the cut lines A-A' shown in the plan view 230 of FIG. 2B.

In FIG. 2A, the pixel 200 has sections positioned in layers extending from the light receiving surface or side shown at the top in FIG. 2A. The pixel 200 is contained within DTI walls 208, which, as shown in FIG. 2B, form a vertical or surrounding edge or surface of the pixel 200, and form a well or region in which other parts of the pixel 200 are located. In the particular embodiment shown FIG. 2A, the DTI walls 208 extend from the top light receiving surface to at or near the electrical connection surface shown at the bottom of the chip of the image sensor that includes the pixel 200. However, this is not required.

The pixel 200, in this embodiment, includes an on-chip lens (OCL) 202. The OCL 202 may serve to focus or direct the incoming light 201 into the well or region of the pixel 200 between the DTI walls 208. The OCL 202 may be supported on a metal shield 204 placed on the top of the DTI walls 208.

An inert material layer 206 forms an upper layer of the pixel 200 underneath the OCL 202. The inert material layer 206 may be optically clear to transmit all light wavelengths, or may filter some wavelengths. In additional and/or alternative embodiments, a color filter (not shown in FIG. 2A), such as part of a Bayer or other color filter pattern, may be positioned between the OCL 202 and the inert material layer 206.

The pixel 200 includes a silicon layer 210 below the inert material layer 206. The silicon layer 210 may be either doped or undoped. The silicon layer 210 may be part of a substrate of the chip or wafer of the image sensor that includes the pixel 200. The silicon layer 210 has, at its interface with the inert material layer 206, an inverted pyramid array (IPA) 211 surface feature. A high-k material (high dielectric constant relative to silicon dioxide) may be positioned on the IPA 211 at the interface of the inert material layer 206 and the silicon layer 210. The photodiode 212 may be formed within the silicon layer 210 by implantation or another technology.

The pixel 200 includes, below the photodiode 212, an isolation well material layer 214, which in some embodiments may be a p-type material. The isolation well material layer 214 may serve as a barrier to flow of charge carriers from the photodiode 212 to the other regions of the pixel 200. The pixel 200 includes two storage nodes 216a and 216b below the isolation well material layer 214. In this embodiment, the two storage nodes 216a and 216b are located within a lateral layer within the pixel 200, and are proximate to the bottom surface of the pixel 200. A floating diffusion node (FD) 218 is located in the same later layer of the pixel 200 that contains the storage nodes 216a and 216b, and positioned between the storage nodes 216a and 216b.

The pixel 200 includes two vertical transfer gates 220a and 220b that extend vertically into the pixel 200 from its bottom surface to the PD 212. The vertical transfer gates 220a and 220b may be as discussed for the vertical transfer gate 136 discussed in relation to FIG. 1C, and may function to control flow of charge carriers induced by received light 201 from the PD 212 into respective storage nodes 216a and 216b. The vertical transfer gates 220a and 220b are labeled as VTGM1 and VTGM2, as they serve to control transfer of charge carriers to the storage nodes 216a and 216b, which may serve as a temporary memory of those charge carriers.

The pixel 200 also includes two read gates 222a and 222b, which may be located either on the bottom surface or within and near the bottom surface of the pixel 200. The two read gates 222a and 222b may function to control respective movement of charge carriers from the storage nodes 216a and 216b to the FD node 218, such as for read out. The two read gates 222a and 222b are labeled as TGR1 and TGR2, respectively.

In other aspects of the pixel 200, the IPA 211 may provide diffusing of the received light 201, which may provide reduction of an angular response difference of the received light 201 between the storage nodes 216a and 216b. In some embodiments, the two storage nodes 216a and 216b are approximately symmetric in shape to provide approximately equal capacity for storage of charge carriers. This aspect may allow for cancellation of parasitic light sensitivity, as explained further below in relation to FIGS. 5A and 5B.

In some embodiments, the pixel 200 may be such that the thickness 209a of the silicon layer 210, from the interface with the IPA 211 to the bottom of the PD 212, is at least 5 μm, and the thickness 209b of the remaining layers beneath that is at least 0.4 μm. The thickness 209a and the IPA 211 may function to reduce parasitic light sensitivity in the storage nodes 216a and 216b.

FIG. 2B illustrates a plan view 230 looking into the pixel 200, in which the inert material layer 206 and silicon layer 210 have been removed to show the relative positions of other components of the pixel 200. In the embodiment shown, the storage nodes 216a and 216b, the vertical transfer gates 220a and 220b, the FD node 218, and the read gates 222a and 222b are positioned in a single lateral layer of the pixel 200 along a single axis.

The pixel 200 may also include any of various control gates or transistors. In the embodiment shown, the pixel 200 includes a row select (RS) transistor 232, a source follower (SF) transistor 234, a reset (RST) transistor 236, and an anti-blooming gate (VTGAB) 238. These four gates may be used to implement shuttering operations, as known to one skilled in the art. Further details of their operations are discussed in relation to FIG. 4G below.

The vertical transfer gates 220a and 220b, the read gates 222a and 222b, and the control gates may be electrically connected, such as by metal traces, with other components of a camera or other device that includes the image sensor of pixel 200. By including the vertical transfer gates 220a and 220b, the read gates 222a and 222b, and the control gates on the chip of the image sensor, it may not be necessary for the image sensor to be joined in a stacked chip design, as in FIG. 1C, with an associated electronics chip 110.

Figure 3A:
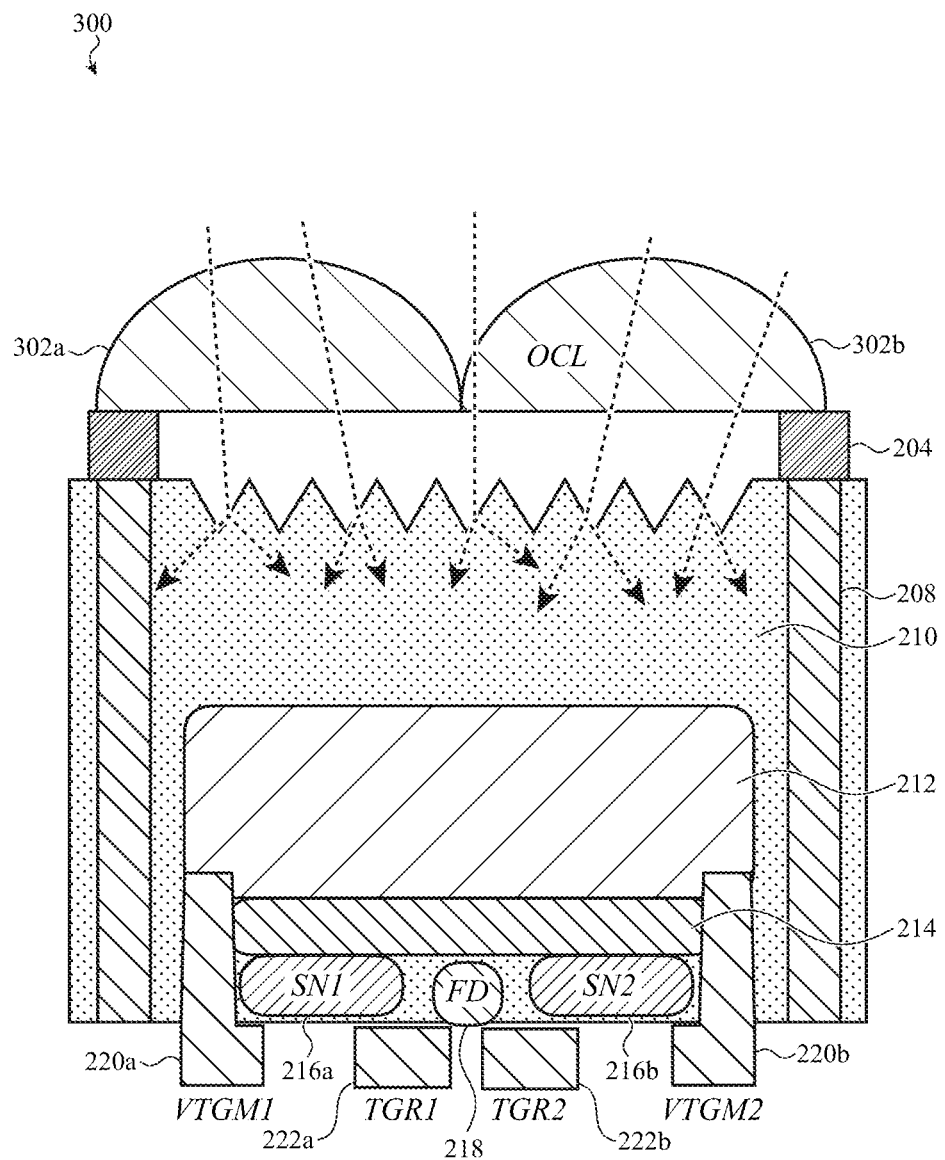
FIG. 3A illustrates a cross-sectional view of a pixel with multiple on-chip lenses, according to an embodiment.
Figure 3B:
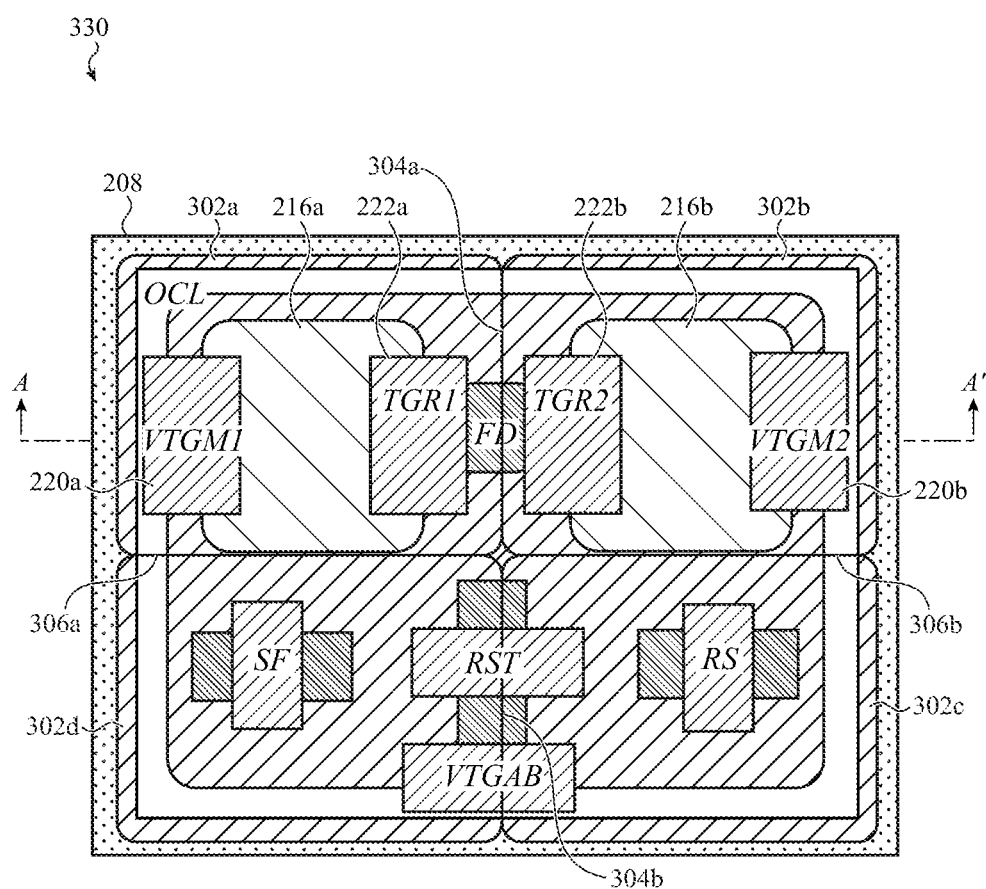
FIG. 3B illustrates a plan view of a pixel of an image sensor.

FIG. 3A shows a cross-sectional view 300 of a variant embodiment of the pixel 200, in which the pixel 200 has four on-chip lenses (OCLs), 302a and 302b shown, with the OCLs 302c and 302d not visible but positioned behind OCLs 302a and 302b. FIG. 3B is a plan view 330 of the pixel 200, as in the plan view 230, showing how the four OCLs 302a-d may be positioned in a two-by-two rectangular pattern on the top surface of the pixel 200. The top two (as per the perspective of FIG. 3B) OCLs 302a and 302b may be either separated or in contact at the virtual vertical axis 304a, and the bottom two OCLs 302c and 302d may be either separated or in contact at the virtual vertical axis 304b. Similarly, the left two OCLs 302a and 302d may be either separated or in contact at the virtual horizontal axis 306a, with the right two OCLs 302b and 302c either separated or in contact at the virtual horizontal axis 306b.

Figure 3C:
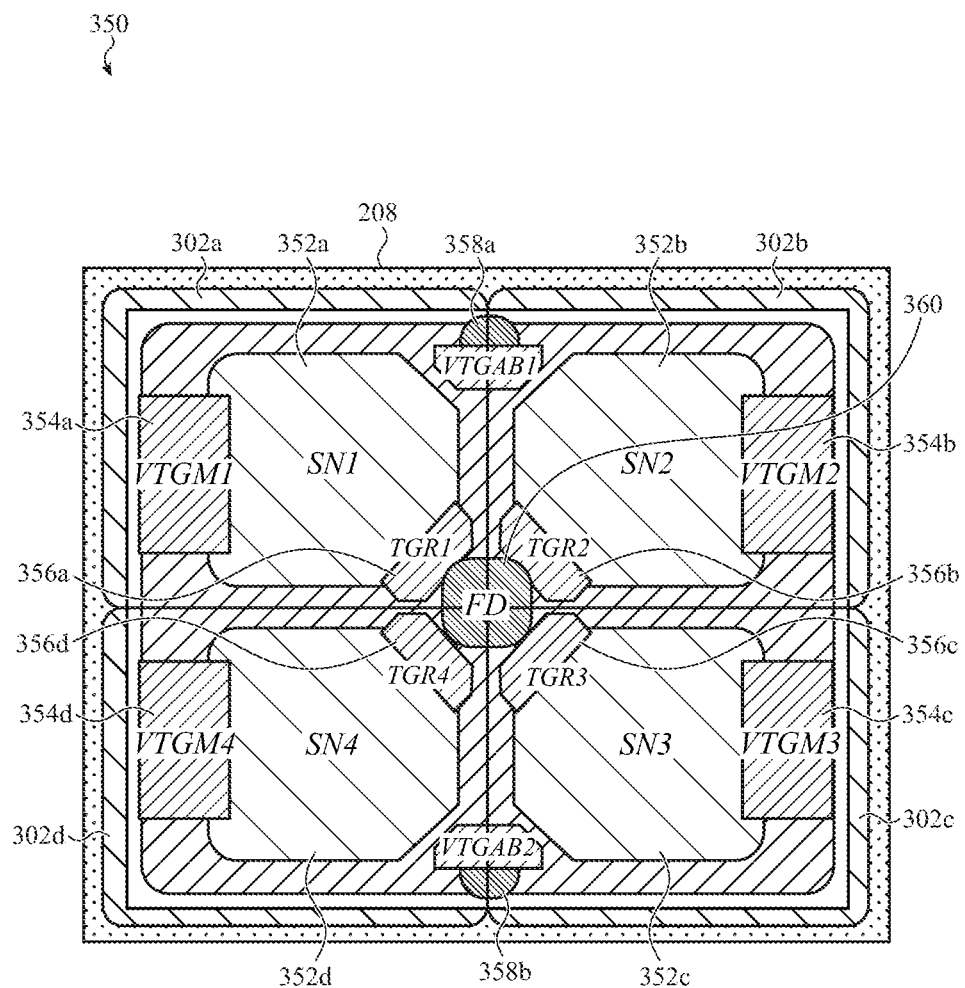
FIG. 3C illustrates a plan view of a pixel of an image sensor.

FIG. 3C shows a plan view 350 of a related embodiment of the pixel 200, in which there are four storage nodes 352a, 352b, 352c, and 352d arranged in a two-by-two array pattern. As with the embodiment of pixel 200 described in relation to FIG. 2A, the storage nodes 352a-d are positioned in a single lateral layer within the pixel 200 beneath an isolation well material layer 214, which is beneath a PD 212. Also, the embodiment shown in FIG. 3C includes four OCLs 302a-d, as described in relation to FIGS. 3A-B. This embodiment of pixel 200, includes, as described above, DTI walls 208, inert material layer 206, and silicon layer 210 having PD 212 and IPA 211.

To accommodate the four storage nodes 352a-d within the pixel 200, control transistors or gates, such as the RS transistor 232 and the SF transistor 234, may be positioned on an associated electronics chip 110, though this is not required.

The pixel 200 shown in FIG. 3C includes four vertical transfer gates 354a, 354b, 354c, 354d (labeled VTGM1, VTGM2, VTGM3, and VTGM4) respectively associated with the corresponding storage nodes 352a-d. Each of the four vertical transfer gates 354a-d controls the movement of charge carriers from the PD 212 into its associated respective storage node. As with the vertical transfer gates 220a-b, the four vertical transfer gates 354a-d may extend vertically from the bottom side of the image sensor into the pixel 200 to the PD 212.

The pixel 200 shown in FIG. 3C has a single floating diffusion node 360 positioned at the common vertex or center of the two-by-two array of the storage nodes 352a-d. Read gates 356a, 356b, 356c, and 356d are positioned near the respective corner of each of storage nodes 352a-d that is nearest the common vertex of the two-by-two array of the storage nodes 352a-d. Read gates 356a-d may control the movement of charge carriers from the respective storage nodes 352a-d into the floating diffusion node 360, from which the charge carriers, or an associated signal, may be received by other components, such as by components on an associated electronics chip 110, or other components of the camera or device. The read gates 356a-d may be formed at least partially within the pixel 200, or formed on the bottom surface of the image sensor below the pixel 200.

The embodiment of pixel 200 shown in FIG. 3C may have more than one anti-blooming transistor, such as the two anti-blooming transistors 358a and 358b.

Figure 4A:
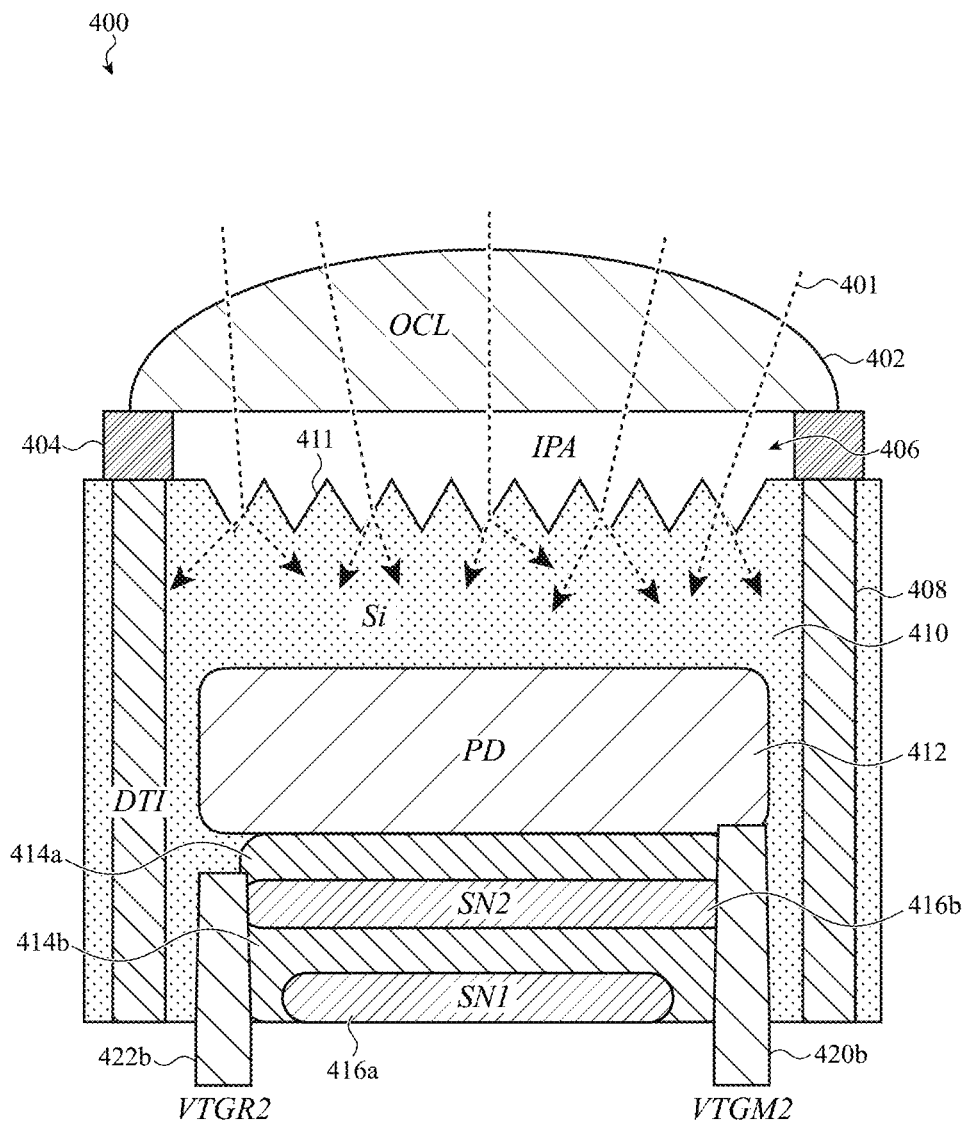
FIG. 4A illustrates a cross-sectional view of a pixel of an image sensor.
Figure 4B:
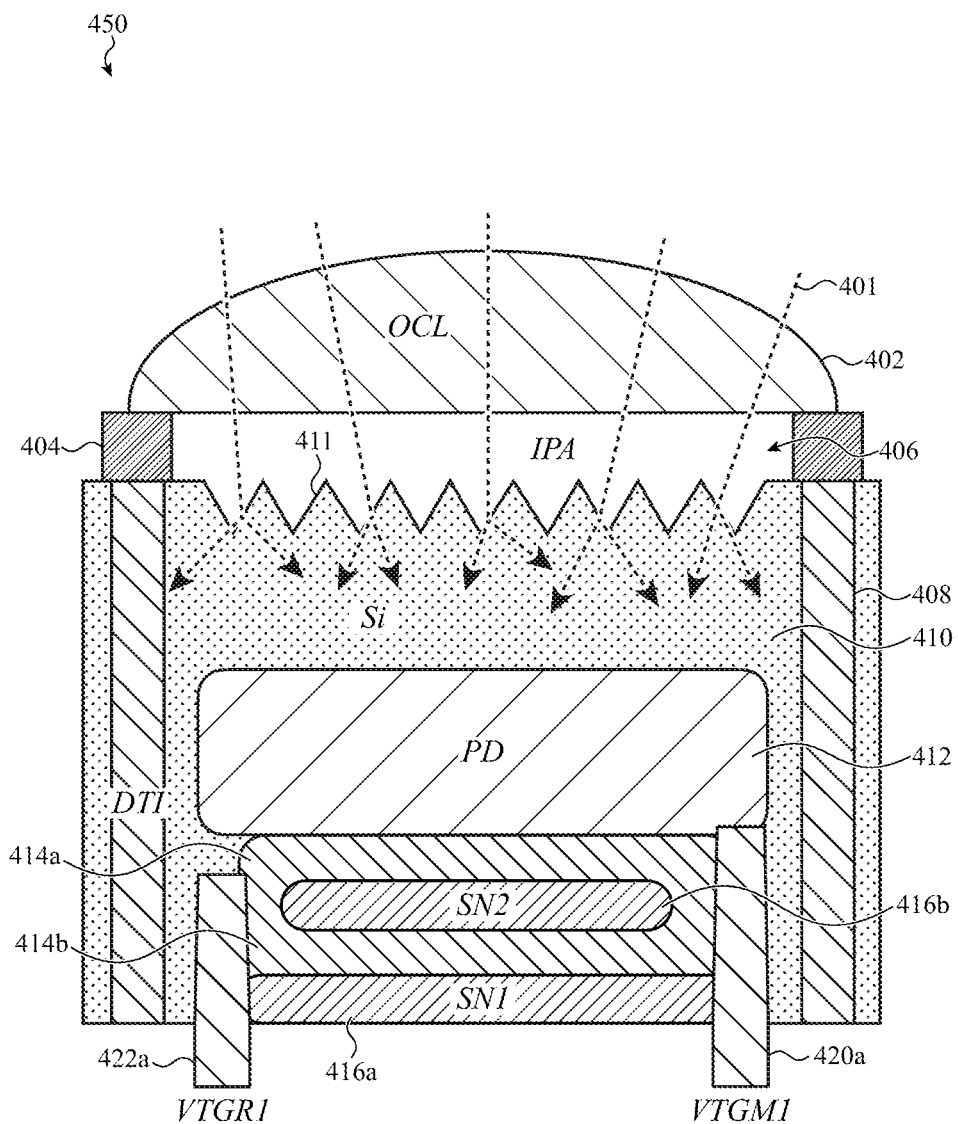
FIG. 4B illustrates another cross-sectional view of a pixel of an image sensor.
Figure 4C:
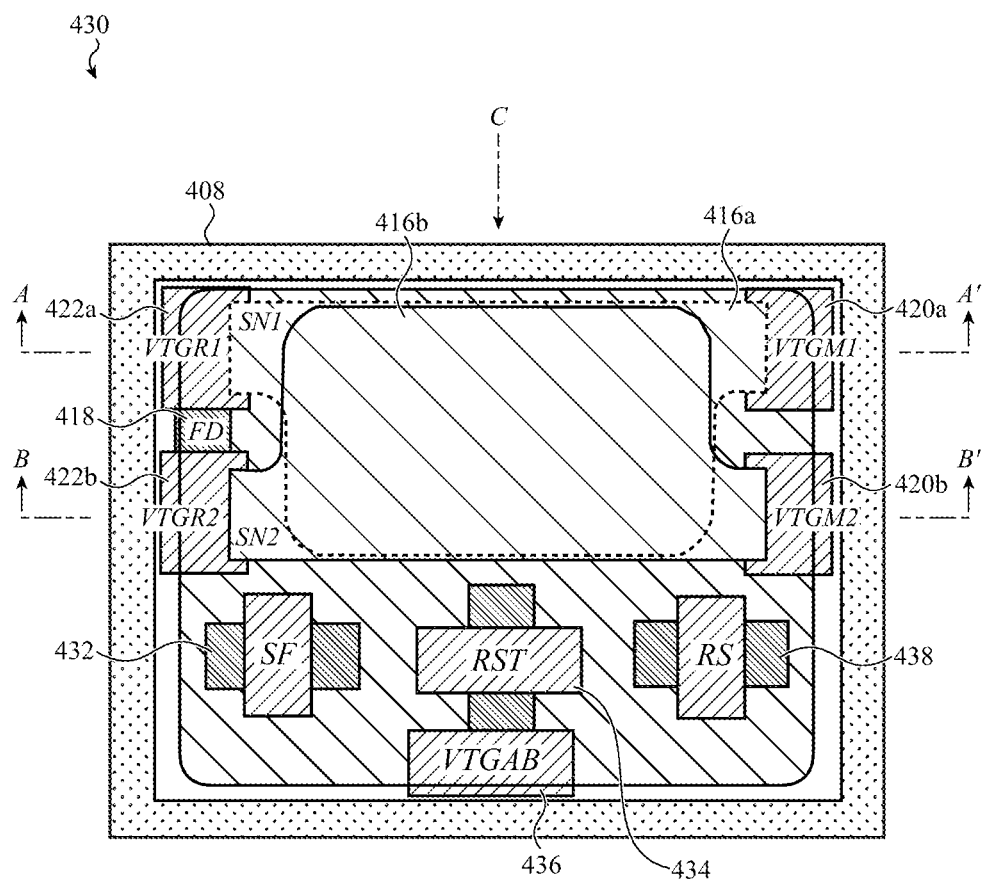
FIG. 4C illustrates a plan view of a pixel of an image sensor.

FIGS. 4A, 4B, and 4C show various views of a pixel 400 having two storage nodes 416a and 416b in a separated, vertically stacked, configuration beneath a photodiode 412, and separated from each other and the photodiode 412 by p-well isolation layers 414a and 414b. The pixel 400 has various features or components similar to those of the pixel 200, and their descriptions will not be repeated here in the same detail.

FIG. 4A shows a cross-sectional view, along the cut line B-B' of FIG. 4C, of the pixel 400. The pixel 400 has DTI walls 408 that extend vertically from a light receiving surface into the pixel 400 to enclose a volume containing other features or elements of the pixel 400. The DTI walls 408 may extend to near or at the 'bottom' electrical connection surface of the image sensor that includes the pixel 400, though this not required.

The pixel 400 includes, shown as an uppermost layer, an inert material layer 406, such as the inert material layer 206 described for the pixel 200. The pixel 400 may have a metal shield 404 positioned on the top of the DTI walls. An on-chip lens (OCL) 402 may be positioned on the inert material layer 406 and metal shield 404. The OCL 402 may function to focus or direct received light 401 into the pixel 400. In other embodiments, a color filter (not shown) may be included between the OCL 402 and the inert material layer 406.

The pixel 400 includes a silicon layer 410 underneath the inert material layer 406. The silicon layer 410 may be formed with an inverted pyramid array (IPA) 411 at its interface with the inert material layer 406. The IPA 411 may provide a diffusion of the received light 401 into the silicon layer 410 to reduce angular response differences between the storage nodes 416a and 416b.

The pixel 400 includes, within and near the bottom (relative to the light receiving surface) of the silicon layer 410, a photodiode (PD) 412. Beneath the PD 412 are connected p-well isolation layers 414a and 414b of p-well isolation material. The cross-sectional view of FIG. 4A does not show that the two p-well isolation layers 414a and 414b are connected, though that may be the case, as shown in FIG. 4B. The two layers may provide a physical separation and a barrier against charge flow between the two storage nodes 416a and 416b.

The pixel 400 includes the vertical transfer gate 420b (labeled VTGM2) that extends from the bottom electrical connection surface of the pixel 400 vertically into the pixel 400 within the DTI walls 408 up to the PD 412. The vertical transfer gate 420b also connects with the storage node 416b (labeled SN2). The vertical transfer gate 420b may operate to control a flow of charge carriers from the PD 412 to the top storage node 416b.

The pixel 400 also includes a vertical read gate 422b (labeled VTGR2) that extends from the bottom electrical connection surface of the pixel 400 vertically into the pixel 400 within the DTI walls 408 up to the storage node 416b. In the embodiment shown, the vertical read gate 422b and the vertical transfer gate 420b are on laterally opposite sides of the storage node 416b, though that is not required. The storage node 416b is laterally wider than the lower storage node 416a so that the vertical transfer gate 420b and the vertical read gate 422b may contact the top storage node 416b without contacting the lower storage node 416a. The vertical read gate 422b may operate to control flow of charge carriers from the PD 412 to a floating diffusion node, as shown in the following figures. The vertical read gate 422b does not extend to the PD 412.

FIG. 4B shows a cross-sectional view 450 of the pixel 400 along the cut line A-A' of FIG. 4C. The cross-sectional view shows that the pixel 400 includes another vertical transfer gate 420a (labeled VTGM1) that extends from the electrical connection surface of the pixel 400 vertically into the pixel 400 within the DTI walls 408 up to the PD 412. The vertical transfer gate 420a also connects with the lower storage node 416a (labeled SN1). The vertical transfer gate 420a may operate to control a flow of charge carriers from the PD 412 to the storage node 416a.

In the cross-section of FIG. 4B, the lower storage node 416a has a greater lateral width than does the upper storage node 416b. This allows for connection of the p-well isolation material between the p-well isolation layers 414a and 414b. This also provides a lateral separation between the vertical transfer gate 420a and the upper storage node 416b.

The pixel 400 also includes another vertical read gate 422a (labeled VTGR1) that extends from the bottom electrical connection surface of the pixel 400 vertically into the pixel 400 within the DTI walls 408 up to the storage node 416a. In the embodiment shown, the vertical read gate 422a and the vertical read gate 422b are on the same lateral side of the storage nodes 416a and 416b, and the vertical transfer gates 420a and 420b are positioned on the opposite lateral side, though that is not required. The vertical read gate 422a may operate to control flow of charge carriers from the PD 412 to a floating diffusion node shown FIG. 4C.

For convenience, the adjective 'first' may be used in referring to the vertical transfer gate 420a, the storage node 416a, and the vertical read gate 422a. The adjective 'second' may be used in referring to the vertical transfer gate 420b, the storage node 416b, and the vertical read gate 422b.

FIG. 4C is a plan view 430 of the pixel 400 in which the inert material layer 406 and the silicon layer 410 have been removed to show other components of the pixel 400. In the embodiment shown, the storage nodes 416a and 416b are each approximately half the lateral cross-sectional area of the pixel 400, though this may be different in other embodiments. In this embodiment, the pixel 400 includes a floating diffusion node 418 positioned between the vertical read gates 422a and 422b.

The pixel 400 in the embodiment shown in FIG. 4C may have space available to include various control transistors, so that an image sensor with pixels according to this embodiment may not need to include an associated electronics chip 110. The embodiment shown in FIG. 4C includes a source follower (SF) transistor 432, a reset transistor (RST) 434, an anti-blooming transistor 436, and a row-select transistor 438. These four control transistors may be formed, at least partially, on the electrical connection surface of the pixel 400.

Figure 4D:
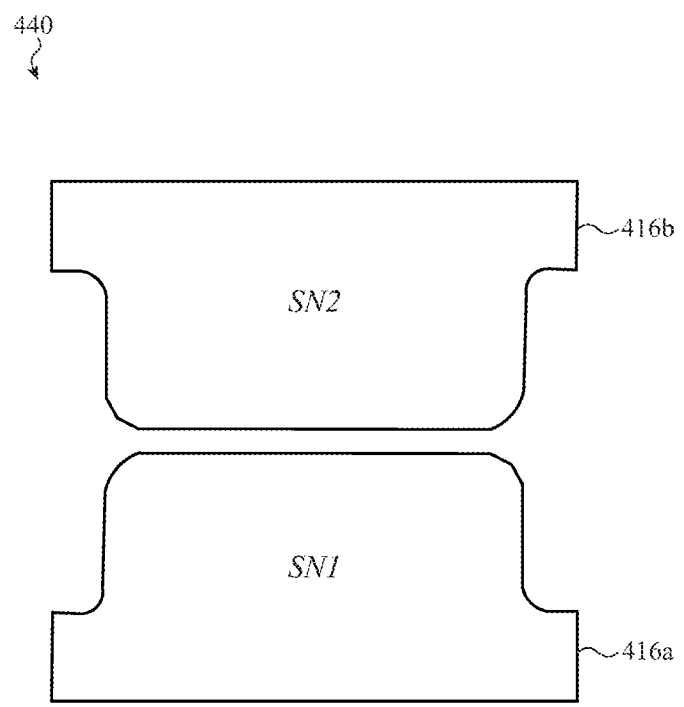
FIG. 4D illustrates a cross-sectional view of a configuration of storage nodes within a pixel of an image sensor.

FIG. 4D is simplified cross-sectional view 440 showing cross-sectional shapes and lateral extensions of the storage nodes 416a and 416b, according to one embodiment. Each storage node's lateral extensions allow for connections with its respective vertical transfer gate and vertical read gate. The cross-sectional shapes of the storage nodes 416a and 416b may be different in other embodiments.

Figure 4E:
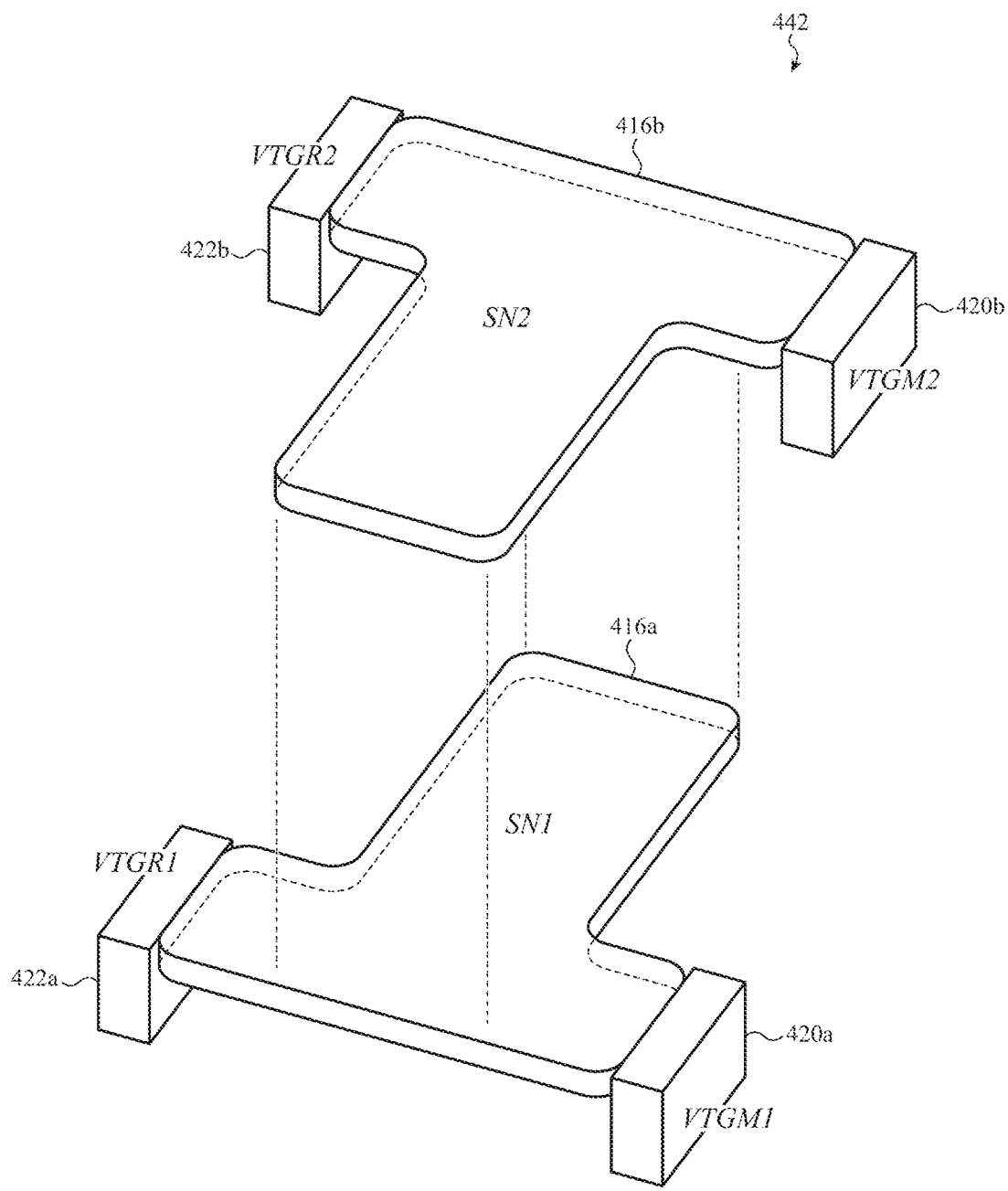
FIG. 4E illustrates a perspective view of a configuration of storage nodes within a pixel of an image sensor.

FIG. 4E is an exploded perspective view 442 of storage nodes 416a and 416b along the view line C of FIG. 4C, showing how the lateral extensions just described of the storage nodes 416a and 416b are located oppositely. Though the storages nodes 416a and 416b are shown as having flat surfaces, they may also have the cross-sectional shapes shown in FIG. 4D. For the storage node 416a, one side of its lateral extension interfaces with the vertical transfer gate 420a (VTGM1), while on the opposite side the lateral extension interfaces with the vertical read gate 422a (VTGR1). Similarly, for the top storage node 416b, one side of its lateral extension interfaces with the vertical transfer gate 420b (VTGM2), while on the opposite side the lateral extension interfaces with the vertical read gate 422b (VTGR2). The vertical transfer gates 420a and 420b are to be understood as extending beyond the levels of their respective storage nodes 416a and 416b to at least the PD 412, as shown in FIGS. 4A and 4B.

Figure 4F:
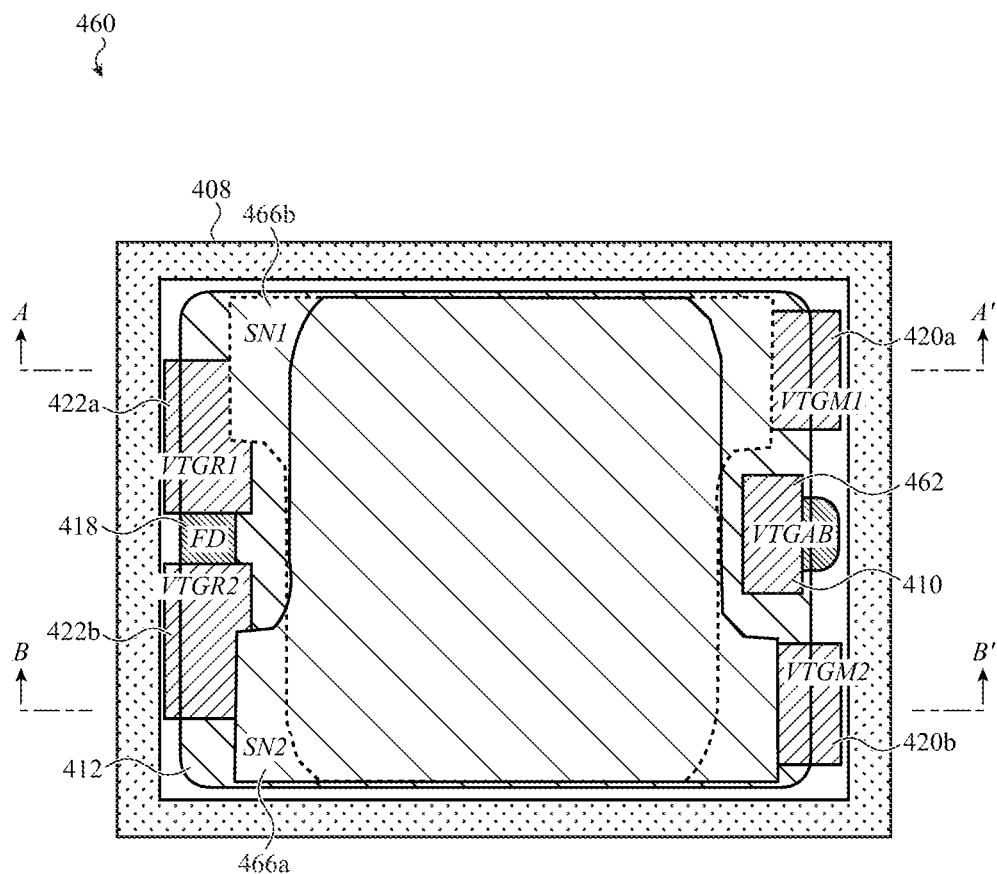
FIG. 4F illustrates a plan view of a pixel of an image sensor.

FIG. 4F shows a plan view 460 of a modified embodiment of the pixel 400. This modified embodiment differs from the embodiment described in relation to FIG. 4C by having storage nodes 466a and 466b expanded to fill laterally more than half of a lateral cross-sectional area of the pixel 400. The p-well isolation material similarly separates the storage nodes 466a and 466b as in the embodiment of FIG. 4C. The DTI walls 408, silicon layer 410, and photodiode 412 are as described for the embodiment of FIGS. 4A-C. The cross-sectional views along the cut lines A-A' and B-B' of FIG. 4F are as described for the cross-sectional views in FIGS. 4A-B along the respective cut lines of FIG. 4C.

In the embodiment of FIG. 4F, the SF transistor 432, row select transistor 438, and reset transistor 434 have been relocated exterior to the pixel 400, such as on an associated electronics chip 110. In the embodiment of FIG. 4F, the anti-blooming transistor has been positioned between the vertical transfer gates 422a and 422b.

Figure 4G:
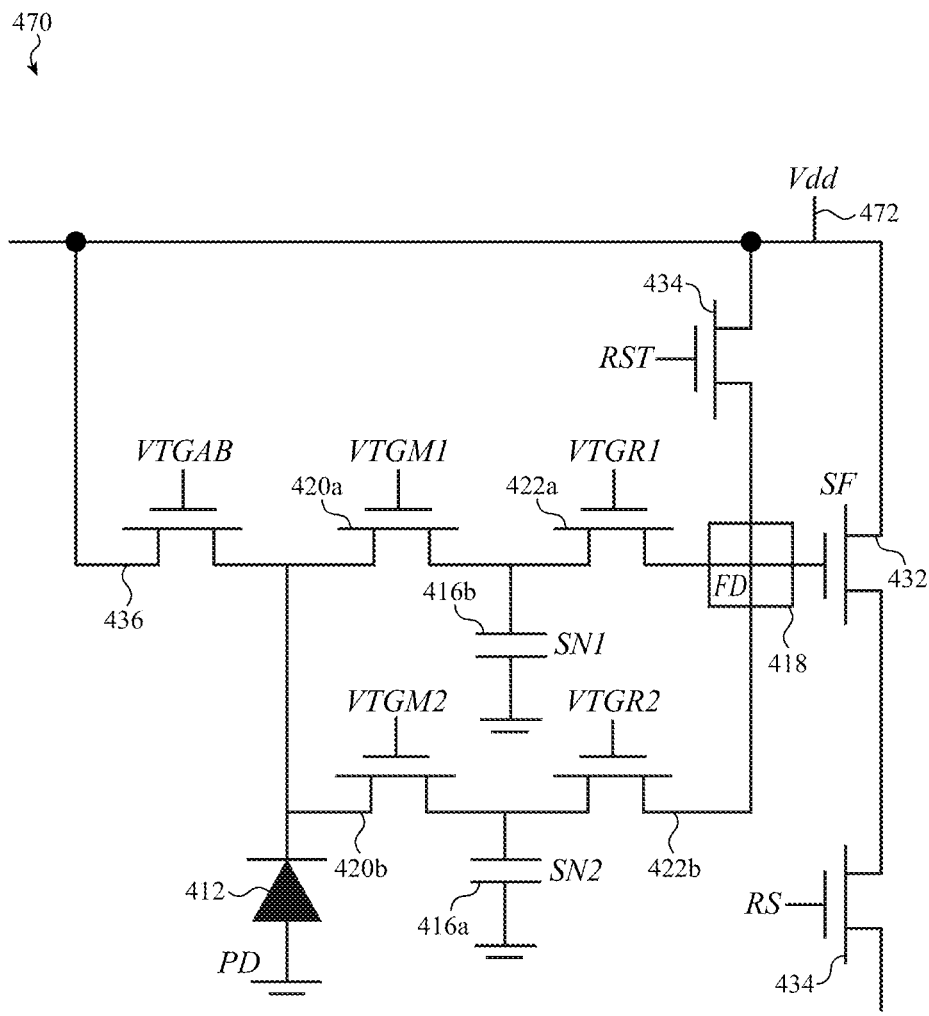
FIG. 4G illustrates an equivalent circuit diagram for a pixel of an image sensor.

FIG. 4G is an equivalent circuit diagram for the pixels of the embodiments of FIGS. 2A-3B, and FIGS. 4A-F; in particular, FIG. 4G is an equivalent circuit diagram for the pixel 400. An equivalent circuit diagram for the pixel of FIG. 3C with four storage nodes may include two further lines extending from the cathode end of the photodiode 412 through corresponding vertical transfer gates, storage nodes, and read gates to the floating diffusion node 418, as would be understood by one skilled in the art. The equivalent circuit diagram of FIG. 4G of the pixels is presented as a convenience for understanding the following methods of operation described in FIGS. 5A, 5B, and 6.

Figure 5A:
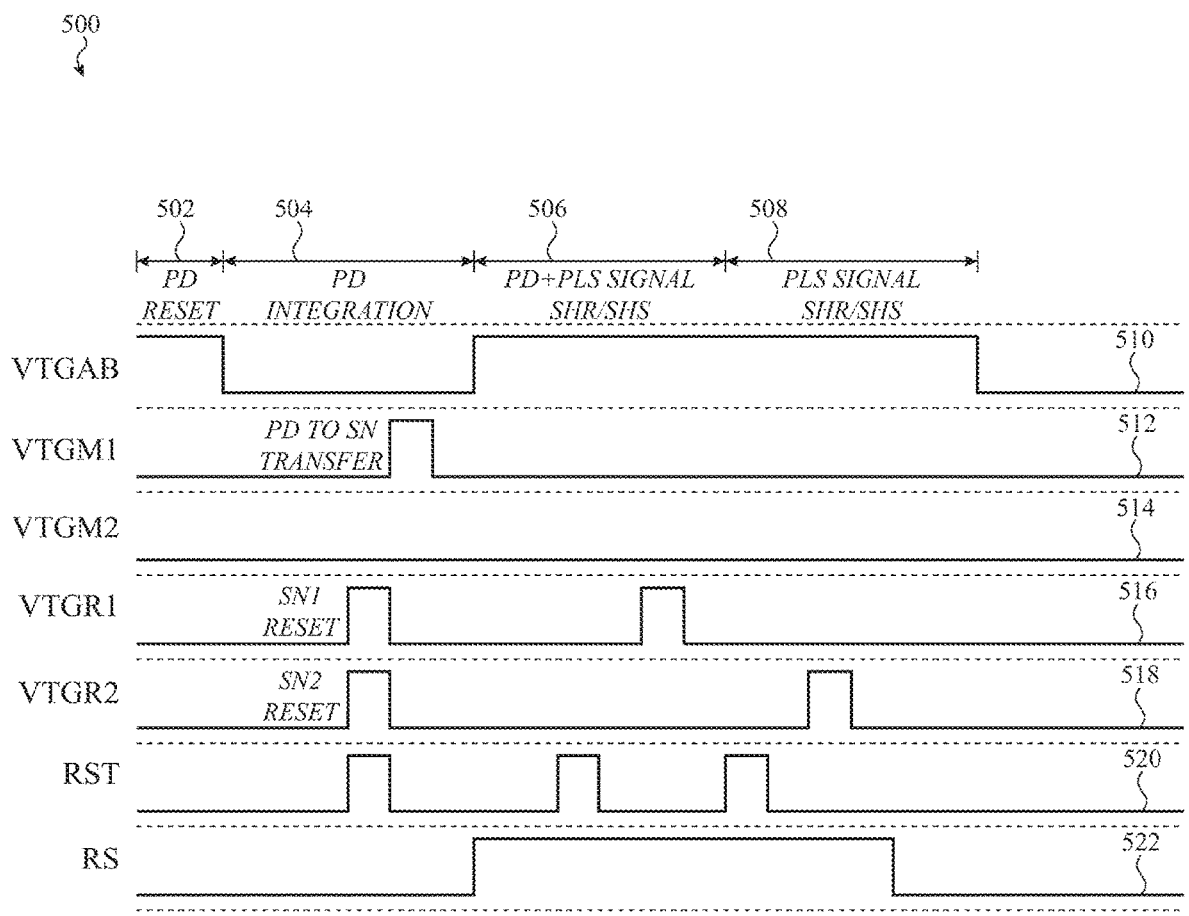
FIG. 5A illustrates a timing diagram of signals for a pixel of an image sensor.
Figure 5B:
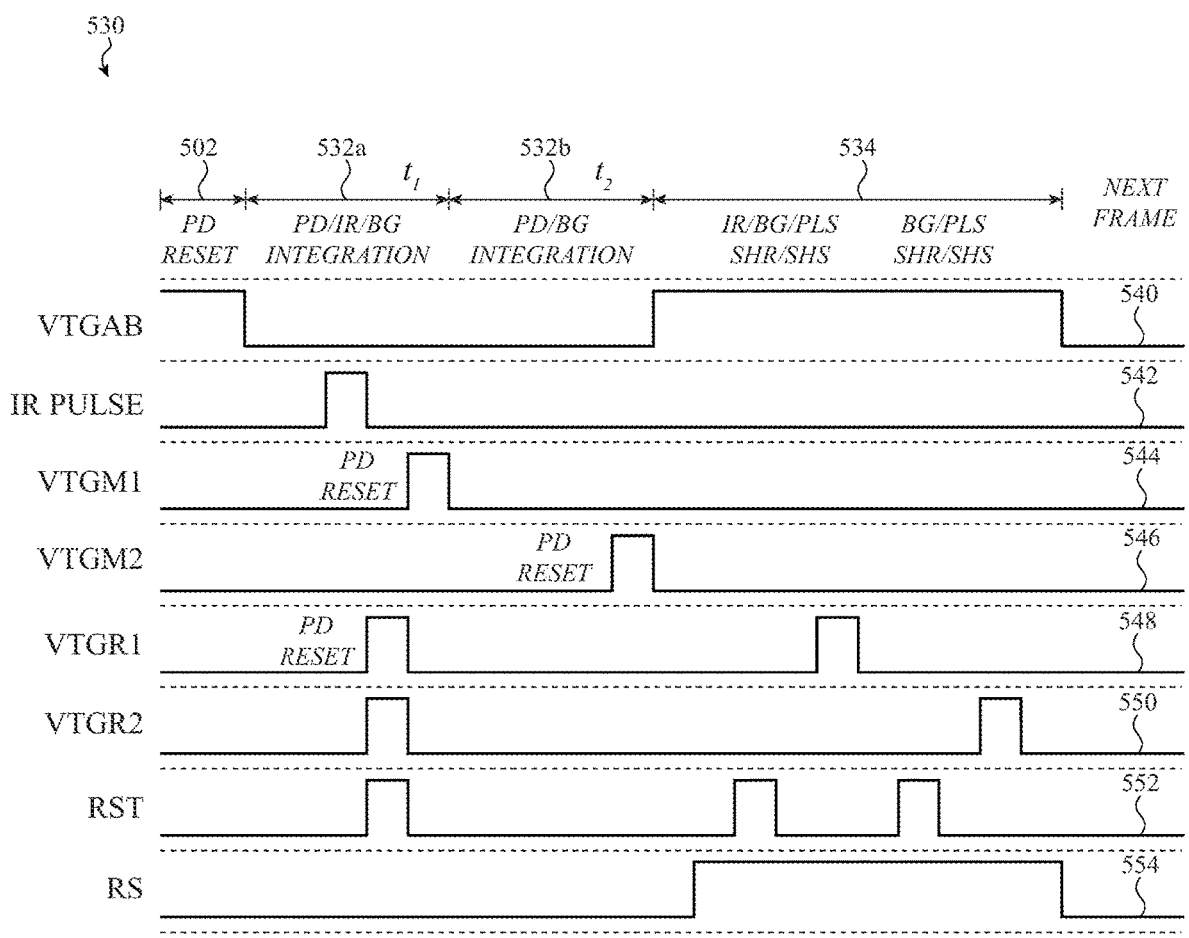
FIG. 5B illustrates a timing diagram of signals for a pixel of an image sensor.
Figure 6:
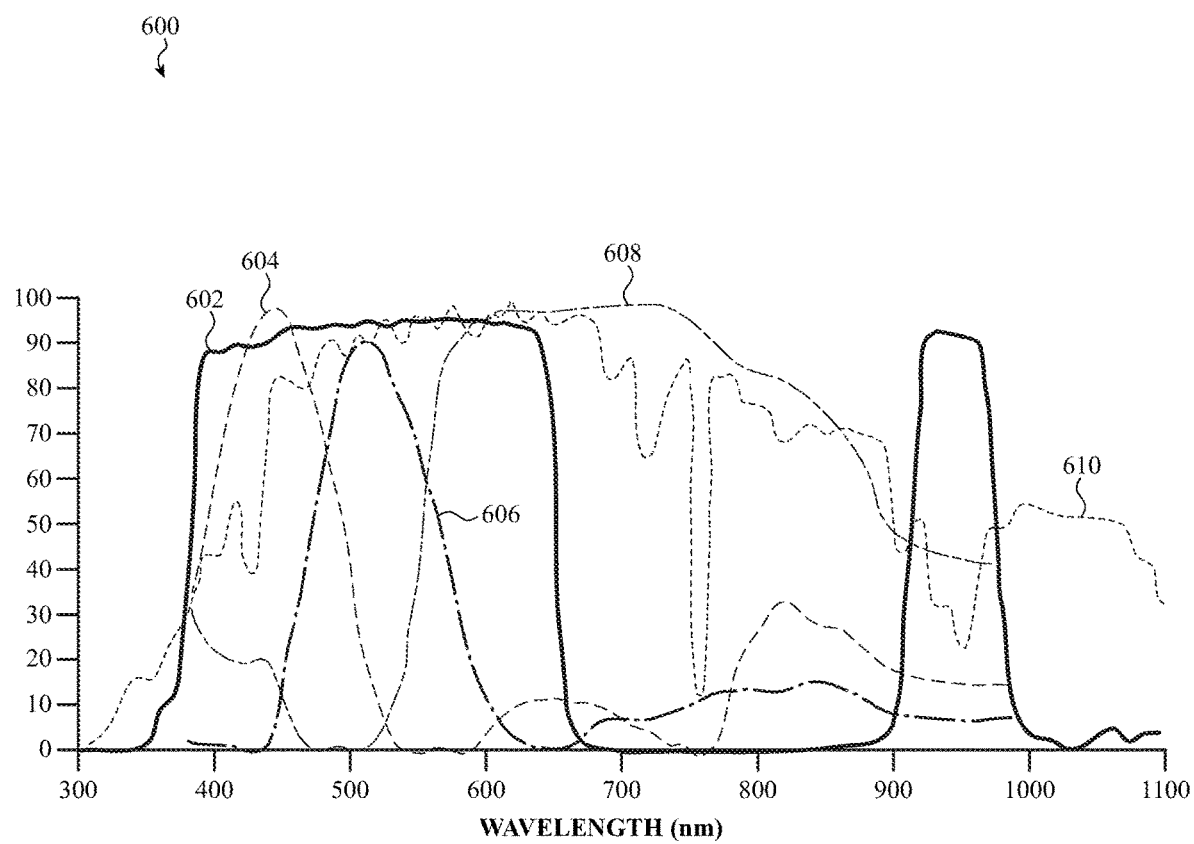
FIG. 6 illustrates a dual band filter response for a lens for a pixel of an image sensor.

FIGS. 5A, 5B, and 6 relate to methods of operation of image sensors having pixels with two or more storage nodes, such as in the various embodiments described above. The vertical transfer gates, the read gates (or vertical read gates of the embodiments of FIGS. 4A-F), and various control transistors may control reception and accumulation of light-induced charge carriers in the photodiode, movement of the charge carriers to the storage nodes and subsequently to the floating diffusion node, and then to other components of an image sensor. The methods of operation to be described may be used to cancel or compensate for parasitic light sensitivity, or to cancel or compensate for background light. Since two or more storage nodes are available within each pixel, different light measurements (e.g., background light versus light received during a shutter operation) may be obtained for comparison or compensation. The timing diagrams may be implemented with those embodiments of pixels having the equivalent circuit diagram of FIG. 1D or FIG. 4G, though one skilled in the art will understand how to adapt the methods for other pixels, such as the pixel 200 of FIG. 3C. For simplicity of explanation only, the methods described in relation FIGS. 5A-6 will refer to the equivalent circuit diagram of FIG. 4G; one skilled in the art will recognize how the methods apply to other embodiments.

FIG. 5A shows a timing diagram 500 for various signals that may be applied to the gates or transistors that are part of, or are associated with, the pixels having at least two storage nodes as in the various embodiments described above. The signals of the timing diagram 500 implement a method for compensating for parasitic light sensitivity (PLS) of elements within the pixel 400, such as PLS related to the storage nodes 416a and 416b. For example, in a global shutter operation of an image sensor, PLS may result from generation of charge carriers in the storage nodes 416a and 416b during times when the shutter is nominally closed. Received light may induce charge carriers at the photodiode 412 that are transferred to a first storage node 416a, while the second storage node 416b receives no charge from the photodiode 412. Charge carriers in the second storage node 416b may be used as an indication of PLS of the pixel 400.

In the timing diagram 500 there are four time intervals during which different operations may be performed by elements of the pixel 400 or associated components. During the first time interval 502, the photodiode 412 is reset to remove possible remaining charge carriers that may have been generated during a preceding frame or shutter operation. This is accomplished by applying a positive input signal 510 to the anti-blooming transistor 436 during the first time interval 502.

During the second time interval 504, the photodiode 412 acquires charge carriers induced by received light. During the second time interval 504, the first storage node 416a and the second storage node 416b are each cleared of possible remaining charges by applying the respective signals 516 and 518 to first vertical read gate 422a and the second vertical read gate 422b, as well as by applying the signal 520 to the reset transistor 434.

During the third time interval 506, charge carriers in the photodiode 412 are transferred to the first storage node 416a by applying the signal 512 to the first vertical transfer gate 420a. The signal 514 applied to the second vertical transfer gate 420b is kept low so that charge in the second storage node 416b is a result of PLS. The second pulse on the signal 516 applied to the first vertical read gate 422a allows the charge in the first storage node 416a to move to subsequent circuit elements (which may include sample-and-hold (SHS/SHR) components, and may be on an associated electronics chip), from which a photodiode signal may be generated that is a measure of a combination of light received at the photodiode and the PLS.

During a fourth time interval 508, the signal 518 applied to the second vertical read gate 422b allows charge in the second storage node 416b to move to the subsequent circuit elements, from which a parasitic light signal may be generated.

The signal 522 is applied to the row select transistor 438 when the photodiode signal and the parasitic light signal are to be generated. The parasitic light signal may be subtracted from the photodiode light signal to obtain a compensated signal that may provide a better representation of the light received at the photodiode.

FIG. 5B is a timing diagram 530 of signals that may be applied to the various gates and transistors that are part of, or are associated with, the pixels having at least two storage nodes described in the embodiments above. The methods associated with the timing diagram 530 may be used by an image sensor, or an associated device, that has a light source, such as a laser, that can emit light into a field of view of the image sensor. Examples of such devices include cameras that use lasers for range finding, such as for autofocus. The methods associated with the timing diagram 530 are directed to compensating for effects of background light and parasitic light sensitivity during detection of reflections of the emitted light at the image sensor.

To implement the method, an image sensor, or an associated device, may have an infrared light source, such as a laser, that can emit light into a field of view of the image sensor. The image sensor or its associated device may also include a dual passband (DPB) filter as described in FIG. 6 to remove certain bands of light while passing the infrared light of the infrared light source. Including such a DPB filter may reduce the amount of background light received at the pixels of the image sensor.

In the timing diagram 530, there are four time intervals during which different operations may be performed by elements of the pixel 400 or associated components. As in the method associated with the timing diagram 500 of FIG. 5A, during the first time interval 502, the photodiode 412 is reset to remove possible remaining charge carriers that may have been generated during a preceding frame or shutter operation. This is accomplished by applying the positive input signal 540 to an anti-blooming transistor 436.

During the second time interval 532a, an infrared light pulse 542 is emitted from the associated infrared light source into the field of view of the image sensor. Also during the second time interval 532a, the first and second storage nodes are reset when the first and second vertical read transfer gates 422a and 422b receive the first pulses of the respective signals 548 and 550 and the reset transistor receives the first pulse of the signal 552.

During the second time interval 532a, charge carriers generated by both received background light and reflections of the emitted infrared light pulse 542 are integrated or gathered at the photodiode 412. At the end of the second time interval 532a, with duration of time $t_1$, the integrated charge carriers are transferred to the first storage node 416a when the first vertical transfer gate 420a receives the pulse of the signal 544, and the photodiode 412 is also reset.

During a third time interval 532b, the photodiode 412 receives no reflections of the emitted light but only receives background light. At the end of the third time interval 532b, the charge in the photodiode 412 is moved to the second storage node 416b when the second vertical transfer gate 420b receives the pulse on the signal 546. The duration of the third time interval 532b, $t_2$, may be taken to equal the duration time $t_1$ of the second time interval 532a in order for approximately equal amounts of charge carriers generated by background light to be produced in each.

During a fourth time period 534, the respective signals 548 and 550 of the first and second vertical read gates 422a and 422b, together with enabling of the row-select transistor 438 by the signal 554, cause the respective charges of the first and second storage nodes 416a and 416b to move to subsequent circuit elements (which may include sample-and-hold (SHS/SHR) components, and may be on an associated electronics chip). A first resulting signal based on the charge from the first storage node 416a may reflect the combination of the infrared light, the background light, and the PLS. A second resulting signal based on the charge from the second storage node 416b may reflect the combination of the background light and the PLS. The difference, or another comparison, of the first and second resulting signal may be used as a measure of the received infrared signal.

FIG. 6 shows a transmission response diagram 600 of an example dual passband (DPB) filter. A DPB filter having the shown transmission response 602 may be used in conjunction with the pixel structures described above, and may be used with the methods described in relation to FIGS. 5A-B. A DPB filter with the transmission response 602 may reduce parasitic light sensitivity of the pixels by filtering light at wavelengths beyond the visible light range, since visible light may be the light range of interest in certain devices, such as cameras. For example, sunlight may have the shown relative intensity 610, which has non-negligible contributions in the wavelengths between 700 nm and 900 nm. A DPB filter having the transmission response 602 may be implemented as one or multiple OCLs above a single pixel as described above, or as a filter positioned above multiple pixels, or as a filter positioned above the image sensor as a whole. The particular transmission response 602 is an example, and is not intended to be limiting; some embodiments may have filters with dual passbands with modified wavelength ranges.

The vertical axis of the transmission response diagram 600 shows the DPB filter's transmission response 602 as a transmission percent of relative intensity. The first passband of the DPB filter transmits a high percentage of visible light having wavelengths from approximately 400 nm up to approximately 680 nm. The transmission response 602 has a second passband in the infrared wavelength band from approximately 900 nm up to approximately 1000 nm. The second passband allows for reception of infrared light, such as may be received according to the methods described in relation to FIG. 5B.

The transmission response diagram 600 includes the relative intensity of the light spectrum of sunlight. The sunlight may include light of wavelengths between the two passbands of the DPB filter. Sunlight at those intermediate wavelengths could, if not filtered, contribute to parasitic light intensity. In some embodiments of the pixels described above, such as those in which the thickness of the silicon layer is greater than 5 μm, the thickness of the silicon layer may contribute to a low parasitic light sensitivity in the visible wavelengths.

The range of wavelengths for the first passband overlaps with Bayer color filter passband responses: the blue Bayer filter response 604, the green Bayer filter response 606, and the red Bayer filter response 608. This may allow for the DPB filter to be used together with Bayer color filters in an image sensor.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An image sensor, comprising:
   a semiconductor wafer having a light receiving surface opposite an electrical connection surface;
   an oxide extending from the light receiving surface toward the electrical connection surface and at least partially surrounding a pixel region;
   a photodiode disposed within the pixel region; and
   a set of storage nodes disposed under the photodiode, between the photodiode and the electrical connection surface, the set of storage nodes comprising:
   a first storage node; and
   a second storage node; and
   a floating diffusion node connected to the first storage node, connected to the second storage node, and disposed under the photodiode.

2. The image sensor of claim 1, further comprising:
   an inert material layer adjacent to the light receiving surface; and
   a silicon layer between the inert material layer and the electrical connection surface;
   wherein:
   the silicon layer interfaces with the inert material layer in an inverted pyramid array structure, and
   the silicon layer includes the photodiode.

3. The image sensor of claim 1, further comprising an on-chip lens positioned over the pixel region on the light receiving surface.

4. The image sensor of claim 1, further comprising a set of four on-chip lenses positioned on the light receiving surface in a two-by-two pattern.

5. The image sensor of claim 1, further comprising:
   a first vertical transfer gate within the pixel region extending from the electrical connection surface to the photodiode and proximate to the first storage node; and
   a second vertical transfer gate extending within the pixel region from the electrical connection surface to the photodiode proximate to the second storage node.

6. The image sensor of claim 5, further comprising control transistors positioned in the pixel region proximate to the electrical connection surface, the control transistors including at least one of the following:
   a source follower transistor;
   a reset transistor;
   an anti-blooming transistor; or
   a row select transistor.

7. The image sensor of claim 5, wherein the first storage node and the second storage node are positioned in a single layer of a storage node layer below the photodiode and approximately parallel to the light receiving surface.

8. The image sensor of claim 5, further comprising:
   a first read gate positioned on the electrical connection surface proximate to the first storage node and the floating diffusion node; and
   a second read gate positioned on the electrical connection surface proximate to the second storage node and the floating diffusion node.

9. The image sensor of claim 5, further comprising:
   a third storage node;
   a third vertical transfer gate proximate to the third storage node and extending from the electrical connection surface to the photodiode;
   a fourth storage node; and
   a fourth vertical transfer gate proximate to the fourth storage node and extending from the electrical connection surface to the photodiode; wherein:
   the first storage node, the second storage node, the third storage node, and the fourth storage node are positioned in a single layer of a storage node layer as a two-by-two array; and
   the floating diffusion node is proximate to a common vertex of the two-by-two array.

10. The image sensor of claim 9, further comprising:
    a control chip, wherein:
    the control chip is electrically connected with the semiconductor wafer and interfaces with the electrical connection surface; and
    the control chip includes a set of control transistors for the pixel region, the set of control transistors including at least one of the following:
    a source follower transistor;
    a reset transistor;
    an anti-blooming transistor; or
    a row select transistor.

11. The image sensor of claim 9, further comprising:
    a first read gate positioned on the electrical connection surface proximate to the first storage node and the floating diffusion node;

a second read gate positioned on the electrical connection surface proximate to the second storage node and the floating diffusion node;

a third read gate positioned on the electrical connection surface proximate to the third storage node and the floating diffusion node; and a fourth read gate positioned on the electrical connection surface proximate to the fourth storage node and the floating diffusion node.

12. An image sensor, comprising:

a semiconductor wafer having:
  a light receiving surface; and
  an electrical connection surface opposite the light receiving surface; and a pixel within the semiconductor wafer extending between the light receiving surface and the electrical connection surface and enclosed by deep trench isolation walls that extend from the light receiving surface toward the electrical connection surface; wherein the pixel comprises:
  an inert material layer adjacent to the light receiving surface;
  a silicon layer below the inert material layer;
  a photodiode within the silicon layer and spaced apart from the inert material layer;
  an isolation well layer below the silicon layer;
  a first storage node under the photodiode;
  a second storage node under the photodiode;
  a first vertical transfer gate extending from the electrical connection surface to the photodiode and proximate to the first storage node and operable to control movement of charge carriers from the photodiode to the first storage node;
  a second vertical transfer gate extending from the electrical connection surface to the photodiode and proximate to the second storage node and operable to control movement of charge carriers from the photodiode to the second storage node; and
  a floating diffusion node connected to the first storage node, connected to the second storage node, and disposed under the photodiode.

13. The image sensor of claim 12, wherein the silicon layer includes an inverted pyramid array structure interfacing with the inert material layer.

14. The image sensor of claim 12, further comprising an on-chip lens positioned on the light receiving surface.

15. The image sensor of claim 12, wherein the pixel further comprises:
  the floating diffusion node positioned proximate to the electrical connection surface;
  a first vertical read gate extending between the first storage node and the floating diffusion node and to the electrical connection surface; and
  a second vertical read gate extending between the second storage node and the floating diffusion node and to the electrical connection surface.

16. The image sensor of claim 15, wherein:
  the first vertical transfer gate and the second vertical transfer gate are positioned within the pixel proximate to a first wall of the deep trench isolation walls; and
  the first vertical read gate and the second vertical read gate are positioned within the pixel proximate to a second wall of the deep trench isolation walls, the second wall opposite to the first wall; and
  the floating diffusion node is positioned within the pixel proximate to the first vertical read gate and the second vertical read gate.

17. The image sensor of claim 15, wherein the first storage node and the second storage node each laterally extends for more than half of a cross-sectional area within the deep trench isolation walls between the light receiving surface and the electrical connection surface.

* * * * *